(12) United States Patent
Podder et al.

(10) Patent No.: US 11,886,837 B2
(45) Date of Patent: Jan. 30, 2024

(54) SIMULATION-BASED SOFTWARE DESIGN AND DELIVERY ATTRIBUTE TRADEOFF IDENTIFICATION AND RESOLUTION

(71) Applicant: ACCENTURE GLOBAL SOLUTIONS LIMITED, Dublin (IE)

(72) Inventors: Sanjay Podder, Thane (IN); Vikrant Kaulgud, Pune (IN); Vibhu Saujanya Sharma, Bangalore (IN); Sanjay Mittal, Bangalore (IN); Ravi Kiran Velama, Bangalore (IN); Adam Patten Burden, Tampa, FL (US)

(73) Assignee: ACCENTURE GLOBAL SOLUTIONS LIMITED, Dublin (IE)

( * ) Notice: Subject to any disclaimer, the term of this patent is extended or adjusted under 35 U.S.C. 154(b) by 0 days.

(21) Appl. No.: 17/716,827

(22) Filed: Apr. 8, 2022

(65) Prior Publication Data
US 2022/0326913 A1 Oct. 13, 2022

(30) Foreign Application Priority Data
Apr. 10, 2021 (IN) .............................. 202111016888

(51) Int. Cl.
G06F 8/20 (2018.01)
G06F 8/10 (2018.01)

(52) U.S. Cl.
CPC . G06F 8/20 (2013.01); G06F 8/10 (2013.01)

(58) Field of Classification Search
CPC .................................................. G06F 8/10–20
(Continued)

(56) References Cited

U.S. PATENT DOCUMENTS 6,405,364 B1 * 6/2002 Bowman-Amuah .. G06Q 10/06
717/124
7,089,534 B2 * 8/2006 Hartman ............. G06F 11/3684
717/125
(Continued)

FOREIGN PATENT DOCUMENTS

EP 3090037 A1 11/2016
GB 2479469 A 10/2011
WO 2018039445 A1 3/2018

OTHER PUBLICATIONS

Navarro et al, "Comprehensive Evaluation of an Educational Software Engineering Simulation Environment", IEEE, pp. 1-8 (Year: 2007).*

(Continued)

Primary Examiner — Anil Khatri
(74) Attorney, Agent, or Firm — Mannava & Kang, P.C.

(57) ABSTRACT

In some examples, simulation-based software design and delivery attribute tradeoff identification and resolution may include receiving requirements specification, and generating, based on an analysis of the requirements specification, canonical sustainability requirements. Based on an analysis of the canonical sustainability requirements, sustainable software attribute decisions and an attribute optimization score may be generated, and used to generate a sustainable software attribute balance score and a tradeoff attributes list. Based on an analysis of the sustainable software attribute balance score and the tradeoff attributes list, a green quotient may be generated and used to generate an architecture document. Further, based on an analysis of the architecture document, software quality rules may be generated, and used to generate a software application.

20 Claims, 23 Drawing Sheets

(58) Field of Classification Search
USPC .................................................. 717/104–120
See application file for complete search history.

(56) References Cited

U.S. PATENT DOCUMENTS

| | | | | |
|---|---|---|---|---|
| 7,840,944 | B2* | 11/2010 | Brunswig | G06F 11/3688 717/124 |
| 7,890,924 | B2* | 2/2011 | Raffo | G06Q 10/06 717/113 |
| 7,949,180 | B2 | 5/2011 | Maeda et al. | |
| 8,006,223 | B2* | 8/2011 | Boulineau | G06Q 10/06313 705/7.29 |
| 8,584,080 | B2* | 11/2013 | Gery | G06F 8/35 703/22 |
| 8,628,331 | B1* | 1/2014 | Wright | G09B 19/00 434/323 |
| 8,732,058 | B2 | 5/2014 | Margolis et al. | |
| 8,776,015 | B1* | 7/2014 | Hosagrahara | G06F 8/24 717/113 |
| 8,972,931 | B1* | 3/2015 | Pillarisetti | G06F 8/10 703/22 |
| 8,997,038 | B2* | 3/2015 | Bozek | G06F 8/30 717/106 |
| 9,565,053 | B2 | 2/2017 | Kadota | |
| 9,965,377 | B1* | 5/2018 | Russell | G06F 11/28 |
| 10,181,059 | B1* | 1/2019 | Brewton | G06F 8/20 |
| 10,311,442 | B1* | 6/2019 | Lancaster | G16H 10/00 |
| 11,397,663 | B2* | 7/2022 | Vezier | G06F 11/3664 |
| 2008/0313596 | A1* | 12/2008 | Kreamer | G06Q 10/06 717/101 |
| 2012/0208254 | A1 | 8/2012 | Smith et al. | |
| 2013/0192321 | A1 | 8/2013 | Cheiky et al. | |

OTHER PUBLICATIONS

Setamanit et al, "Planning and Improving Global Software Development Process Using Simulation", ACM, pp. 8-14 (Year: 2006).*
Fu et al, "Simulation Optimization: A Review, New Developments, and Applications", ACM, pp. 83-95 (Year: 2005).*
Singhal et al, "State of The Art of Machine Learning for Product Sustainability", IEEE, pp. 197-202 (Year: 2020).*
Calero et al, "A Systematic Literature Review for Software Sustainability Measures", IEEE, pp. 46-53 (Year: 2013).*
Heilala et al, "Simulation-Based Sustainable Manufacturing System Design", IEEE, pp. 1922-1930 (Year: 2008).*
"The charcoal vision: A win-win-win scenario for simultaneously producing bioenergy, permanently sequestering carbon, while improving soil and water quality", Agronomy Journal, American Society of Agronomy, Inc, US, vol. 100, No. 1, pp. 178-181, ISSN: 0002-1962, DOI: 10.2134/AGRONJ2007.0161. (Jan. 1, 2008).

* cited by examiner

| Attribute | Weight | Tradeoff Summary | Tradeoff Mitigation | Gain |
|---|---|---|---|---|
| Decarbonize User Interface and User Experience | 1 | Providing support for persons wi | Follow the best practices of "Darc | By modifying the existing user interface to x |
| Maximize Digital Accessibility of Software | 1 | Employing a dark palette may pu | Cross check the best practices for | According to Accenture's global research, co |
| Build inclusive software/systems | 1 | NA | NA | Increase the reach of your applications into |

800 → (Attribute column)
802 → (Tradeoff Summary column)
804 → (Gain column)

FIG. 8

Decarbonize User Interface and User Experience

1100

❤ Best Practices

✓ Reduce website payload to improve browsing speed.

✓ Employ a dark palette for UI or offer dark mode for users.

*FIG. 11*

| Attribute 1 | Attribute 2 | Relation Type | Intensity |
|---|---|---|---|
| Decarbonize User Interface and User Experience | Build Inclusive software/systems | reinforcing | weak |
| Adopt a Green Cloud and Edge Architecture | Decarbonize User Interface and User Experience | reinforcing | weak |
| Adopt a Green Cloud and Edge Architecture | Build Inclusive software/systems | reinforcing | weak |
| Decarbonize User Interface and User Ex | Maximize Digital Accessibility of Software | conflicting | weak |
| Adopt a Green Cloud and Edge Architec | Comply with Data Residency and Data Privacy | conflicting | Strong |

SIMULATION-BASED SOFTWARE DESIGN AND DELIVERY ATTRIBUTE TRADEOFF IDENTIFICATION AND RESOLUTION

PRIORITY

This application claims priority to commonly assigned and co-pending India Provisional Patent Application Serial No. 202111016888, filed Apr. 10, 2021, titled "SIMULATION-BASED SOFTWARE DESIGN AND DELIVERY ATTRIBUTE TRADEOFF IDENTIFICATION AND RESOLUTION", the disclosure of which is hereby incorporated by reference in its entirety.

BACKGROUND

Various factors may be considered during the development of a software application. Examples of such factors may include performance, security, bias, accessibility, and energy consumption that may need to be factored in during development of the software application. Each factor may influence the development process in a different manner when considered individually or in combination with other factors.

BRIEF DESCRIPTION OF DRAWINGS

Features of the present disclosure are illustrated by way of example and not limited in the following figure(s), in which like numerals indicate like elements, in which:

FIG. 8 illustrates utilization of text information on what is the tradeoff in choosing an attribute and what is the gain to illustrate operation of the simulation-based software design and delivery attribute tradeoff identification and resolution apparatus of FIG. 1 in accordance with an example of the present disclosure;

FIG. 11 illustrates presentation of a selected list of checklist items to illustrate operation of the simulation-based software design and delivery attribute tradeoff identification and resolution apparatus of FIG. 1 in accordance with an example of the present disclosure;

FIG. 13 illustrates a sample output to illustrate operation of the simulation-based software design and delivery attribute tradeoff identification and resolution apparatus of FIG. 1 in accordance with an example of the present disclosure;

DETAILED DESCRIPTION

Figure 1:
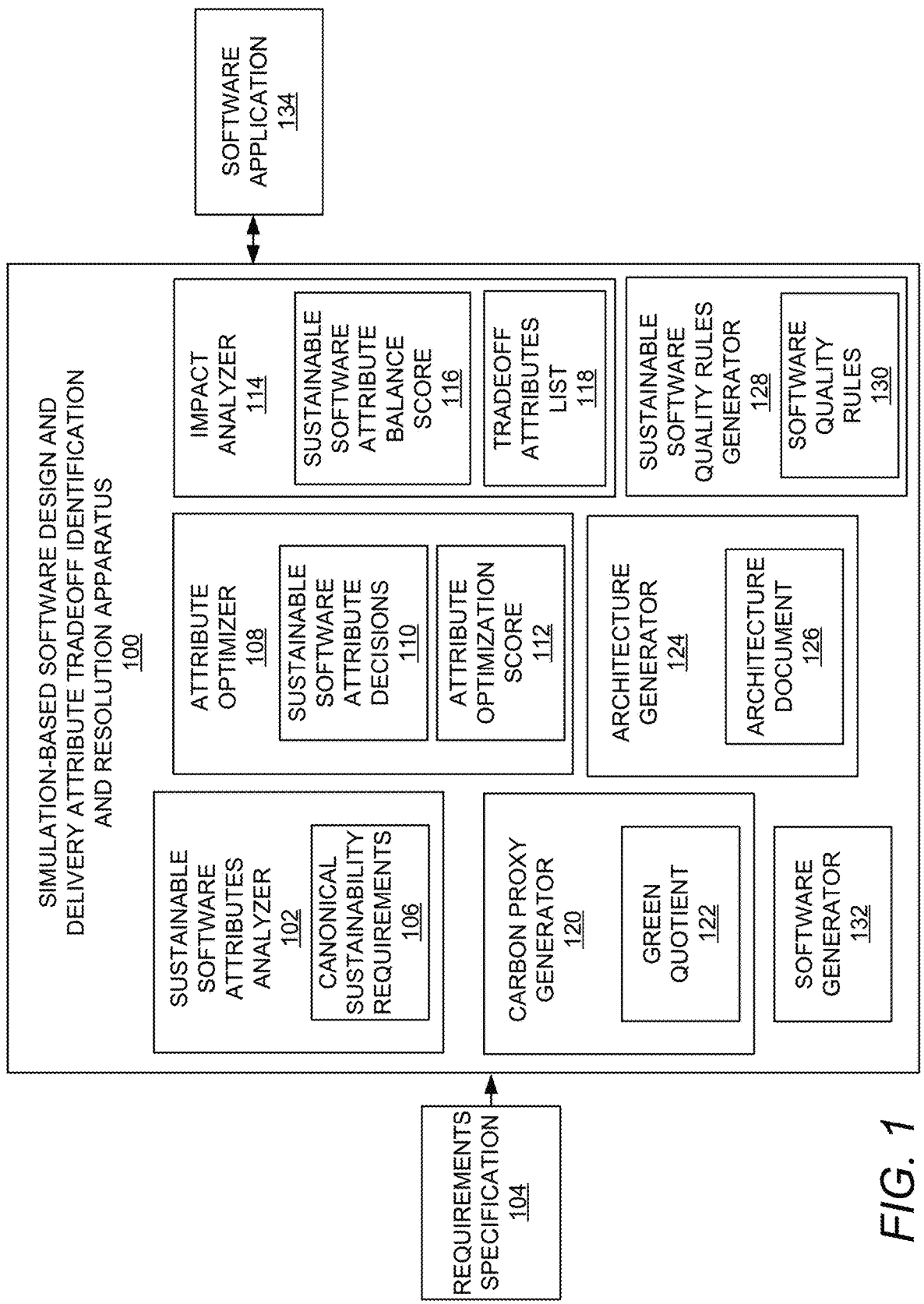
FIG. 1 illustrates a layout of a simulation-based software design and delivery attribute tradeoff identification and resolution apparatus in accordance with an example of the present disclosure.

For simplicity and illustrative purposes, the present disclosure is described by referring mainly to examples. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure.

Throughout the present disclosure, the terms "a" and "an" are intended to denote at least one of a particular element. As used herein, the term "includes" means includes but not limited to, the term "including" means including but not limited to. The term "based on" means based at least in part on.

Simulation-based software design and delivery attribute tradeoff identification and resolution apparatuses, methods for simulation-based software design and delivery attribute tradeoff identification and resolution, and non-transitory computer readable media having stored thereon machine readable instructions to provide simulation-based software design and delivery attribute tradeoff identification and resolution are disclosed herein. The apparatuses, methods, and non-transitory computer readable media disclosed herein provide for evaluation of complex relationships between different sustainable software design attributes and optimization levers to generate balanced sustainable software.

During development of sustainable software, there are several software design and delivery attributes such as performance, security, bias, accessibility, and energy consumption that need to be accounted for. For example, one of the goals of the software design may including reducing the energy consumed by the software when the software is in production and being used by intended users. Another goal may include reducing the energy consumed by a development team during the activities of developing the software. In some cases, decisions taken to achieve such goals can create a sub-optimal design for other goals. For example, with respect to the pursuit of designing energy efficient software, a developer may choose to use a C programming language for certain code sections. However, this choice may reduce the maintainability of code. Similarly, an architect may choose to architect software for a public cloud deployment to reduce energy consumed during production. However, the choice of the cloud and location where workloads are deployed may result in non-compliance of data residency requirements.

Just focusing on energy efficiency of software, trustworthiness of software and inclusion and accessibility considerations, there are several different factors that can be optimized for sustainable software development. In this regard, it is technically challenging to account for and optimize such factors for sustainable software development.

The apparatuses, methods, and non-transitory computer readable media disclosed herein address at least the aforementioned technical challenges by utilizing a graph processing and query engine to identify all secondary design factors that are either reinforcing or conflicting the desired design goals. Having identified the subset of such design factors, a sustainability quality metric that describes the propensity of the software to be holistically balanced across different goal categories may be determined. The sustainability quality metric may be recalculated based on optimizations introduced by the architect and/or developer for specific desired goals. A display of this information may be generated in a dashboard, and a recommendation for a next best actions for continuing with the software development and delivery process may also be generated. In one example, the recommendation for the next best actions for continuing with the software development and delivery process may be automatically (e.g., without human intervention) implemented. That is, the software development and delivery process may be automatically performed.

According to examples disclosed herein, the apparatuses, methods, and non-transitory computer readable media disclosed herein provide for analysis of multiple design categories for identifying the sustainability quality metric, and intelligent optimization of the design decisions for improving the sustainability quality metric.

Sustainability requirements may be expressed in multiple documents and formats. With respect to extracting the sustainability requirements into a canonical form for downstream processing and consumption, the apparatuses, methods, and non-transitory computer readable media disclosed herein may implement a model-based natural language processing (NLP), graphical user interface (GUI) code analysis, computer vision-based (among other requirements form specific techniques) extraction of sustainability requirements and transformation into a canonical form.

With respect to impact analysis for a decision taken to optimize a software attribute, the apparatuses, methods, and non-transitory computer readable media disclosed herein may implement a graph processing technique for performing impact analysis.

With respect to tuning the optimization based on architecture decisions, the apparatuses, methods, and non-transitory computer readable media disclosed herein may implement a feedback loop to iteratively refine decisions for improving sustainability and the balance across sustainability levers. In this regard, the apparatuses, methods, and non-transitory computer readable media disclosed herein may be integrated into a production system and DevOps for a feedback loop.

According to examples disclosed herein, the apparatuses, methods, and non-transitory computer readable media disclosed herein may generate optimizations for a desired sustainability goal.

With respect to knowledge of possible software attributes, the apparatuses, methods, and non-transitory computer readable media disclosed herein may utilize extensible knowledge graphs to drive automation.

With respect to a cross functional architecture team to communicate the decisions and tradeoffs between software attributes and achieve a balanced architecture output, the apparatuses, methods, and non-transitory computer readable media disclosed herein may implement architecture templates and metrics (e.g., scores) to communicate implications of design choices and tradeoffs in a consistent manner.

With respect to comprehending the impact of architecture decisions of sustainability objectives, for example, if the impact is not direct, the apparatuses, methods, and non-transitory computer readable media disclosed herein may implement automated impact analysis and visualization.

With respect to communication of the architecture decisions with a sustainability lens, the apparatuses, methods, and non-transitory computer readable media disclosed herein may implement interactive visualization.

For the apparatuses, methods, and non-transitory computer readable media disclosed herein, the elements of the apparatuses, methods, and non-transitory computer readable media disclosed herein may be any combination of hardware and programming to implement the functionalities of the respective elements. In some examples described herein, the combinations of hardware and programming may be implemented in a number of different ways. For example, the programming for the elements may be processor executable instructions stored on a non-transitory machine-readable storage medium and the hardware for the elements may include a processing resource to execute those instructions. In these examples, a computing device implementing such elements may include the machine-readable storage medium storing the instructions and the processing resource to execute the instructions, or the machine-readable storage medium may be separately stored and accessible by the computing device and the processing resource. In some examples, some elements may be implemented in circuitry.

FIG. 1 illustrates a layout of an example simulation-based software design and delivery attribute tradeoff identification and resolution apparatus (hereinafter also referred to as "apparatus 100").

Referring to FIG. 1, the apparatus 100 may include a sustainable software attributes analyzer 102 that is executed by at least one hardware processor (e.g., the hardware processor 2002 of FIG. 20, and/or the hardware processor 2204 of FIG. 22) to receive requirements specification 104. The sustainable software attributes analyzer 102 may generate, based on an analysis of the requirements specification 104, canonical sustainability requirements 106.

An example of a requirements specification 104 may include the following:
Problem Statement
 Website must allow users to register for newsletter by providing their email ID.
Applicable Entities
 Iterations (except Initiative)
Applicable Methodologies
 Waterfall, Iterative
Requirement 1: "SignUp for Newsletter" button
 Description—Need to add a new button with label "SignUp for Newsletter"
Constraints
 Button color should employ a dark theme.
Requirement 2: Background image
 Description—The background image for the signup page should show the image of a newsletter provided by UX design team.
Constraints
 The image should be responsive and scale to desktop and mobile devices.

The sustainable software attributes analyzer 102 may generate, based on the analysis of the requirements specification 104, the canonical sustainability requirements 106 by extracting text from the requirements specification 104, determining, from the extracted text, whether there is a sustainability string, and based on a determination that there is the sustainability string, extracting text from a sustainability section. Further, based on a determination that there is not the sustainability string, the sustainable software attributes analyzer 102 may extract text from the requirements specification 104, and determine, from the extracted text from the sustainability section or the requirements specification 104, a set of keywords that represent software requirements for the software application.

The sustainable software attributes analyzer 102 may perform term frequency-inverse document frequency keyword detection on the keywords and a requirements ontology, and determine, based on the performance of the term frequency-inverse document frequency keyword detection, an attribute list for the software application.

The sustainable software attributes analyzer 102 may extract, from the requirements specification 104, text under a requirement description and constraints headings to determine a set of requirement strings, and perform, by utilizing the requirements ontology, fuzzy string matching on the set of requirement strings. Further, the sustainable software attributes analyzer 102 may determine, based on the performance of the fuzzy string matching, requirement strings with consistent terminology.

The sustainable software attributes analyzer 102 may determine a set of corresponding requirements in the requirements ontology, and determine a set of the requirement strings with consistent terminology. Further, the sustainable software attributes analyzer 102 may replace each requirement in the set of corresponding requirements in the requirements ontology with a corresponding similar requirement in the set of the requirement strings with consistent terminology, and determine, based on the replacement, the canonical sustainability requirements 106.

An attribute optimizer 108 that is executed by at least one hardware processor (e.g., the hardware processor 2002 of FIG. 20, and/or the hardware processor 2204 of FIG. 22) may generate, based on an analysis of the canonical sustainability requirements 106, sustainable software attribute decisions 110 and an attribute optimization score 112.

The attribute optimizer 108 may generate, based on the analysis of the canonical sustainability requirements 106, the sustainable software attribute decisions 110 and the attribute optimization score 112 requirements by obtaining requirements from a production system associated with the software application, and determining, from the obtained requirements, whether there are additional requirements for the software application from the production system. Further, the attribute optimizer 108 may add the additional requirements to the canonical sustainability requirements 106 and the requirements ontology.

The attribute optimizer 108 may generate the attribute optimization score 112 based on a weighted average of selected optimization checklist items.

An impact analyzer 114 that is executed by at least one hardware processor (e.g., the hardware processor 2002 of FIG. 20, and/or the hardware processor 2204 of FIG. 22) may generate, based on an analysis of the sustainable software attribute decisions 110 and the attribute optimization score 112, a sustainable software attribute balance score 116 and a tradeoff attributes list 118.

The impact analyzer 114 may generate, based on the analysis of the sustainable software attribute decisions 110 and the attribute optimization score 112, the sustainable software attribute balance score 116 and the tradeoff attributes list 118 by adding, for each reinforcing relationship, a reinforcing relationship intensity to the attribute balance score, and reducing, for each conflicting relationship, the attribute balance score by a conflicting relationship intensity. For example, the impact analyzer 114 may add, for each weak reinforcing relationship, a first reinforcing relationship intensity to the attribute balance score, add, for each strong reinforcing relationship, a second reinforcing relationship intensity to the attribute balance score, reduce, for each weak conflicting relationship, the attribute balance score by a first conflicting relationship intensity, and reduce, for each strong conflicting relationship, the attribute balance score by a second conflicting relationship intensity. The first reinforcing relationship intensity may be less than the second reinforcing relationship intensity, and the first conflicting relationship intensity may be greater than the second conflicting relationship intensity.

The impact analyzer 114 may compare the sustainable software attribute balance score 116 to a threshold, and based on a determination that the sustainable software attribute balance score 116 is less than the threshold, generate an alert.

A carbon proxy generator 120 that is executed by at least one hardware processor (e.g., the hardware processor 2002 of FIG. 20, and/or the hardware processor 2204 of FIG. 22) may generate, based on an analysis of the sustainable software attribute balance score 116 and the tradeoff attributes list 118, a green quotient 122.

An architecture generator 124 that is executed by at least one hardware processor (e.g., the hardware processor 2002 of FIG. 20, and/or the hardware processor 2204 of FIG. 22) may generate, based on an analysis of the sustainable software attribute decisions 110, the attribute optimization score 112, and the green quotient 122, an architecture document 126.

A sustainable software quality rules generator 128 that is executed by at least one hardware processor (e.g., the hardware processor 2002 of FIG. 20, and/or the hardware processor 2204 of FIG. 22) may generate, based on an analysis of the architecture document 126, software quality rules 130.

A software generator 132 that is executed by at least one hardware processor (e.g., the hardware processor 2002 of FIG. 20, and/or the hardware processor 2204 of FIG. 22) may generate, based on an analysis of the software quality rules 130, a software application 134.

Operation of the apparatus 100 is described in further detail with reference to FIGS. 2-19.

Figure 2:
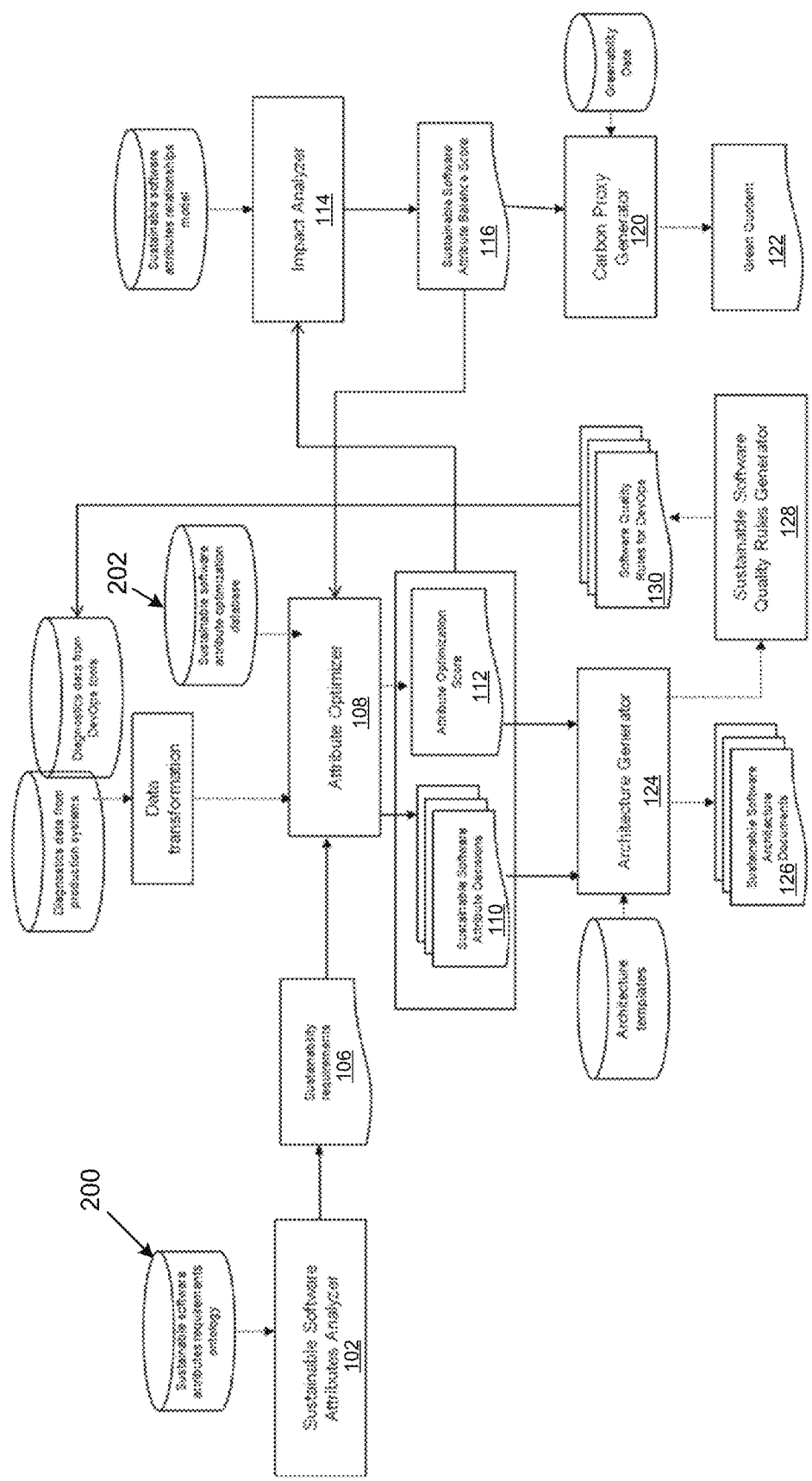
FIG. 2 illustrates an architectural layout of the simulation-based software design and delivery attribute tradeoff identification and resolution apparatus of FIG. 1 in accordance with an example of the present disclosure.
Figure 3:
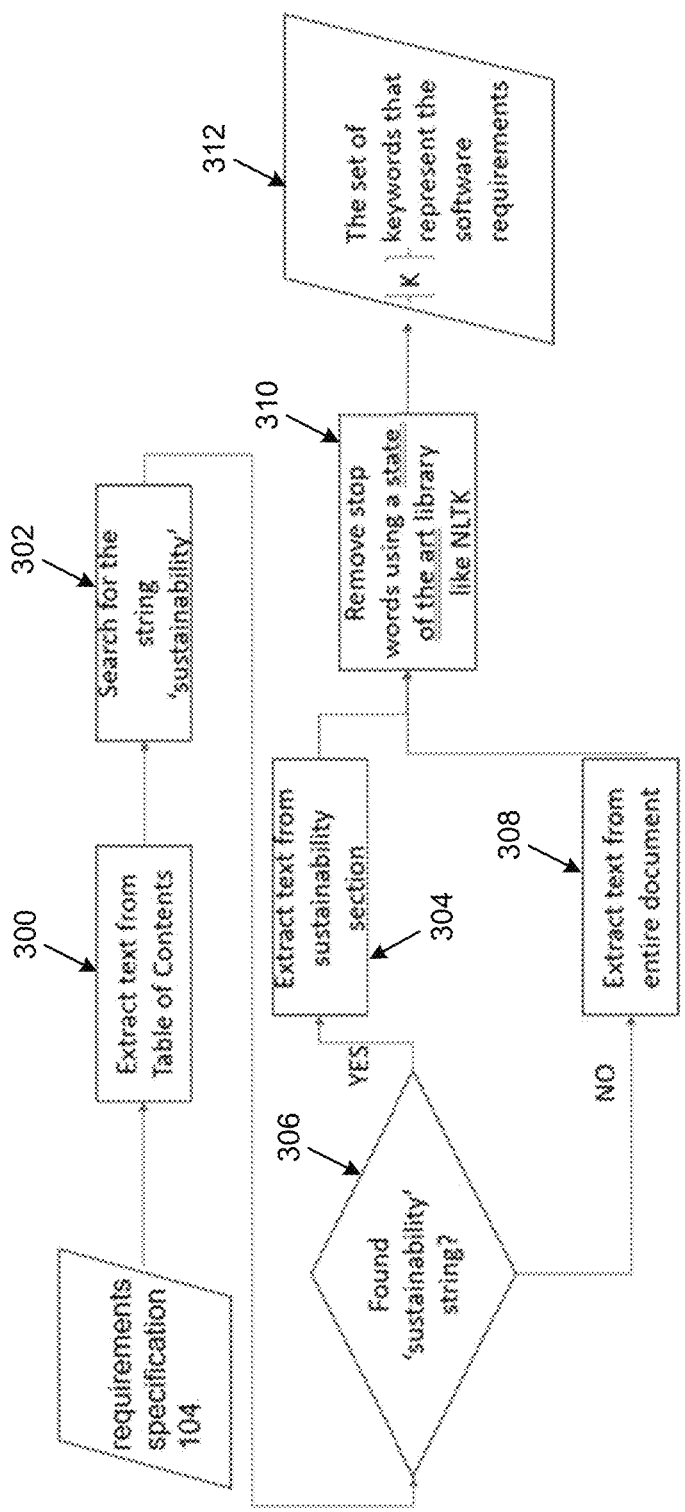
FIG. 3 illustrates determination of keywords that represent software requirements to illustrate operation of the simulation-based software design and delivery attribute tradeoff identification and resolution apparatus of FIG. 1 in accordance with an example of the present disclosure.
Figure 4:
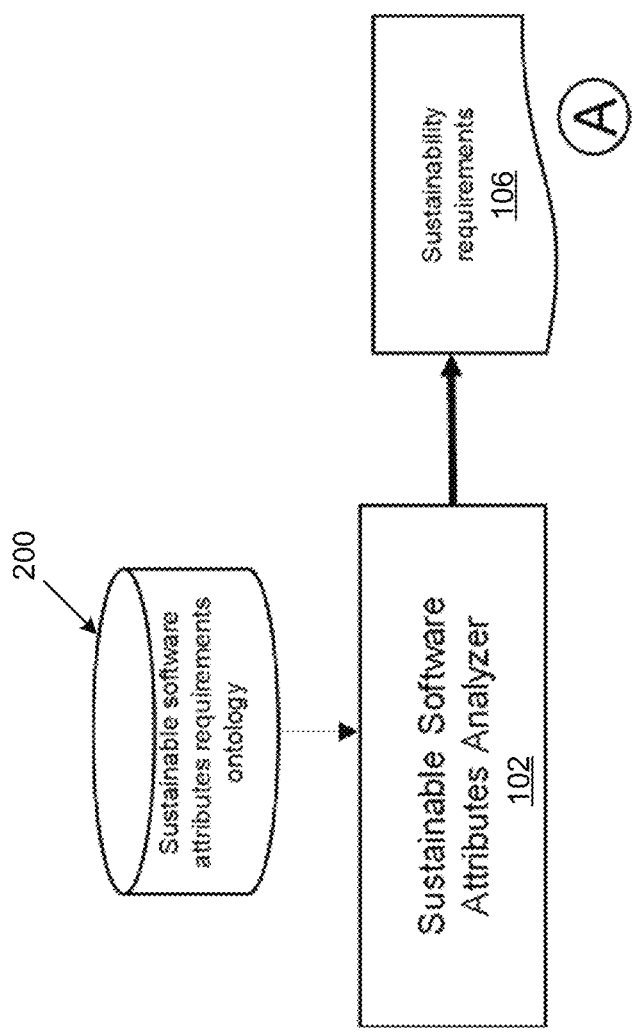
FIG. 4 illustrates operation of a sustainable software attributes analyzer of the simulation-based software design and delivery attribute tradeoff identification and resolution apparatus of FIG. 1 in accordance with an example of the present disclosure.

FIG. 2 illustrates an architectural layout of the apparatus 100 in accordance with an example of the present disclosure. FIG. 3 illustrates determination of keywords that represent software requirements to illustrate operation of the apparatus 100 in accordance with an example of the present disclosure. FIG. 4 illustrates operation of the sustainable software attributes analyzer 102 of the apparatus 100 in accordance with an example of the present disclosure.

Referring to FIGS. 1-4, the sustainable software attributes analyzer 102 may receive the requirements specification 104, and generate, based on an analysis of the requirements specification 104, the canonical sustainability requirements 106. In this regard, input to the sustainable software attributes analyzer 102 may include manual requirements specification 104 or automated extraction. In this regard, the following Steps 0, 1, 2A, 2B, 3, and 4 may be implemented by the sustainable software attributes analyzer 102:

Step 0: Select manual goal or extraction from requirement documents.

Flow 1 for Automated extraction: Requirement document→

Step 1: Select document parsing component based on input documents. In this regard, a text document parsing component may be triggered based on the file format (.docx) when the requirements specification 104 is input to the sustainable software attributes analyzer 102.

Step 2A: For text documents, if a specific sustainability section is available, parse requirements text under that section. If not, parse the entire requirements documents to obtain keywords.

With respect to FIG. 3, the sustainable software attributes analyzer 102 may generate, based on the analysis of the requirements specification 104, the canonical sustainability requirements 106 by extracting text from the requirements specification 104, and determine, from the extracted text, whether there is a sustainability string. Further, based on a determination that there is the sustainability string, the sustainable software attributes analyzer 102 may extract text from a sustainability section. Further, based on a determination that there is not the sustainability string, the sustainable software attributes analyzer 102 may extract text from the requirements specification 104, and determine, from the extracted text from the sustainability section or the requirements specification 104, a set of keywords that represent software requirements for the software application.

Specifically, referring to FIG. 3, K may be specified as the set of keywords representing the requirements specification 104. In this regard, at 300, the sustainable software attributes analyzer 102 may extract text from a table of contents. At 302, a search may be performed for string "sustainability". At 304, based on a determination at 306 that a "sustainability" string has been found, text may be extracted from the sustainability section. At 308, based on a determination at 306 that a "sustainability" string has not been found, text may be extracted from the entire document. At 310, stop words may be removed from the extracted text. Further, at 312, the sustainable software attributes analyzer 102 may determine and specify K as the set of keywords representing the requirements specification 104.

Next, with respect to Steps 0, 1, 2A, 2B, 3, and 4 implemented by the sustainable software attributes analyzer 102, Step 2B may be specified as follows: Use sustainable software attributes requirements ontology 200 for domain specific natural language processing (NLP) to obtain relevant sustainable software attributes.

Figure 5:
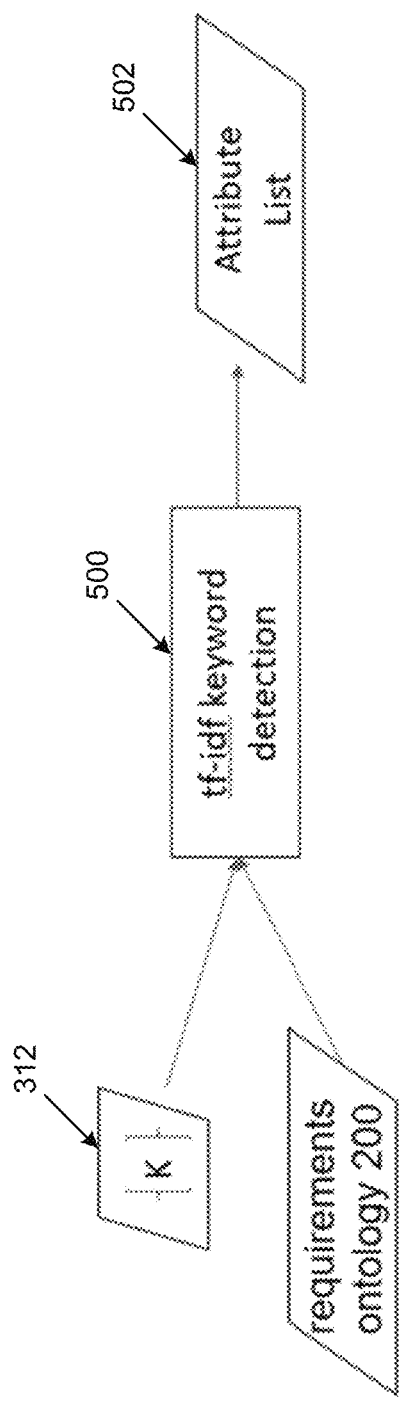
FIG. 5 illustrates utilization of tf-idf keyword detection on a requirements ontology to illustrate operation of the simulation-based software design and delivery attribute tradeoff identification and resolution apparatus of FIG. 1 in accordance with an example of the present disclosure.

FIG. 5 illustrates utilization of tf-idf keyword detection on a requirements ontology to illustrate operation of the apparatus 100 in accordance with an example of the present disclosure.

Referring to FIG. 5, the sustainable software attributes analyzer 102 may perform term frequency-inverse document frequency keyword detection on the keywords and a requirements ontology, and determine, based on the performance of the term frequency-inverse document frequency keyword detection, an attribute list for the software application.

Figure 6:
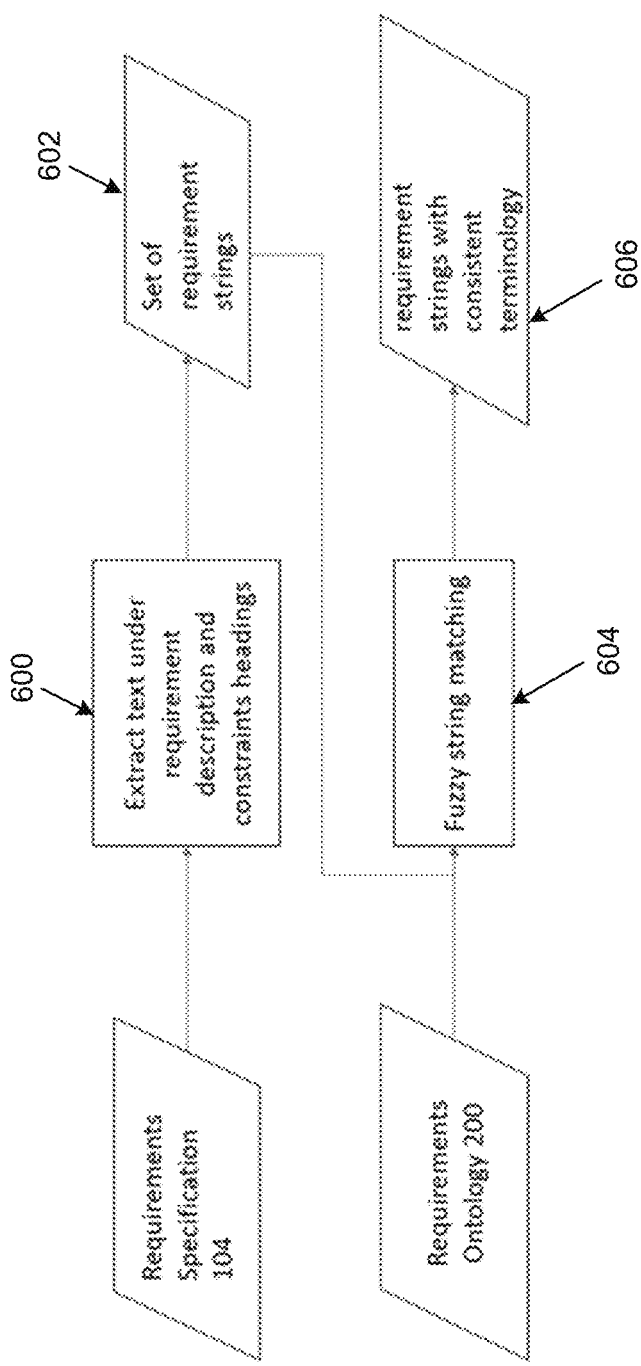
FIG. 6 illustrates elimination of terminological inconsistency using the ontology and fuzzy string matching to illustrate operation of the simulation-based software design and delivery attribute tradeoff identification and resolution apparatus of FIG. 1 in accordance with an example of the present disclosure.

Specifically, with respect to the keywords at 312 representing the requirements specification 104, a tf-idf keyword detection approach may be used at 500 against the requirements ontology 200 to determine an attribute list at 502. In this regard, the sustainable software attributes analyzer 102 may determine the following attributes to be relevant to the requirements specification 104:

Decarbonize User Interface and User Experience
Maximize Digital Accessibility of Software
Build inclusive software/systems FIG. 6 illustrates elimination of terminological inconsistency using the ontology and fuzzy string matching to illustrate operation of the apparatus 100 in accordance with an example of the present disclosure.

With respect to Steps 0, 1, 2A, 2B, 3, and 4 implemented by the sustainable software attributes analyzer 102, Step 3 may be specified as follows: Eliminate terminological inconsistency using the ontology and fuzzy string matching.

Referring to FIG. 6, the sustainable software attributes analyzer 102 may extract, from the requirements specification 104, text under a requirement description and constraints headings to determine a set of requirement strings, perform, by utilizing the requirements ontology, fuzzy string matching on the set of requirement strings, and determine, based on the performance of the fuzzy string matching, requirement strings with consistent terminology.

With respect to Step 3, referring to FIG. 6, at 600, text may be extracted under a requirement description and constraints headings to determine a set of requirement strings at 602. At 604, based on the requirements ontology 200 and the set of requirement strings from block 602, fuzzy string matching may be applied to determine, at 606, requirement strings with consistent terminology. As an example, the sustainable software attributes analyzer 102 may replace the phrase "dark theme" in the requirements specification 104, with the word "dark palette" from the sustainable software attributes requirements ontology 200.

With respect to Steps 0, 1, 2A, 2B, 3, and 4 implemented by the sustainable software attributes analyzer 102, Step 4 may be specified as follows: Disambiguate sustainability requirements and eliminate overlaps.

Figure 7:
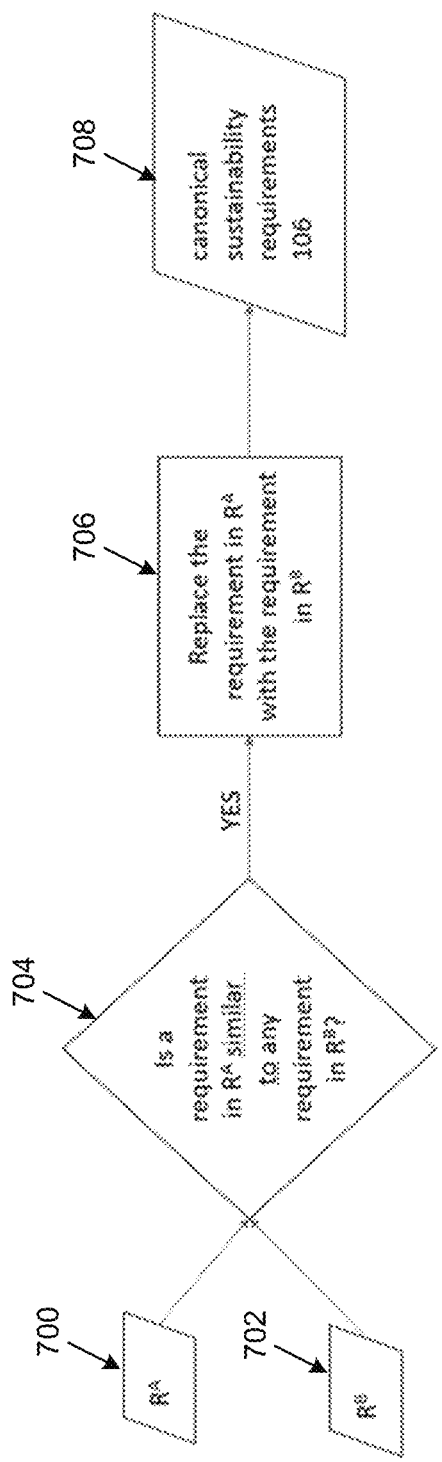
FIG. 7 illustrates elimination of overlaps based on semantic textual similarity of requirement sentences to illustrate operation of the simulation-based software design and delivery attribute tradeoff identification and resolution apparatus of FIG. 1 in accordance with an example of the present disclosure.

FIG. 7 illustrates elimination of overlaps based on semantic textual similarity of requirement sentences to illustrate operation of the apparatus 100 in accordance with an example of the present disclosure.

Referring to FIG. 7, the sustainable software attributes analyzer 102 may determine a set of corresponding requirements in the requirements ontology, and determine a set of the requirement strings with consistent terminology. Further, the sustainable software attributes analyzer 102 may replace each requirement in the set of corresponding requirements in the requirements ontology with a corresponding similar requirement in the set of the requirement strings with consistent terminology, and determine, based on the replacement, the canonical sustainability requirements 106.

For the set of attributes selected in Step 2A, at 700, $R^A$ may be specified to be the set of all corresponding requirements in the ontology, and at 702, $R^B$ may be specified to be the set of requirement strings with consistent terminology obtained in Step 3. At 704, a determination may be made as to whether a requirement in $R^A$ is similar to any requirement in $R^B$. At 706, based on a determination that a requirement in $R^A$ is similar to any requirement in $R^B$, the requirement in $R^A$ may be replaced with the requirement in $R^B$ to determine, at 708, the canonical sustainability requirements 106.

With respect to FIG. 7, based on semantic textual similarity of the requirement sentences, overlaps may be eliminated. Accordingly, the following requirement in set $R^A$ may be specified:

Employ a dark palette for UI or offer dark mode for users. (which may be a duplicate of the following requirement in set $R^B$)

Button color should employ a dark theme.
Prioritize the requirement in set $R^B$ over set $R^A$
As an output of this step, the canonical sustainability requirements 106 may include the following entries of attribute as "Decarbonize User Interface and User Experience" and requirement as "Button color should employ a dark theme".

Based on the aforementioned Steps 0, 1, 2A, 2B, 3, and 4, an output of the sustainable software attributes analyzer 102 may include canonical sustainability requirements 106 (e.g., block 708 of FIG. 7). The sustainable software attributes analyzer 102 may map actionable attributes to each requirement. The sustainable software attributes analyzer 102 may receive, from a user, a specification of the key sustainability optimization goal (e.g., software energy efficiency, inclusion, accessibility, regulatory compliance, etc.).

Figure 9:
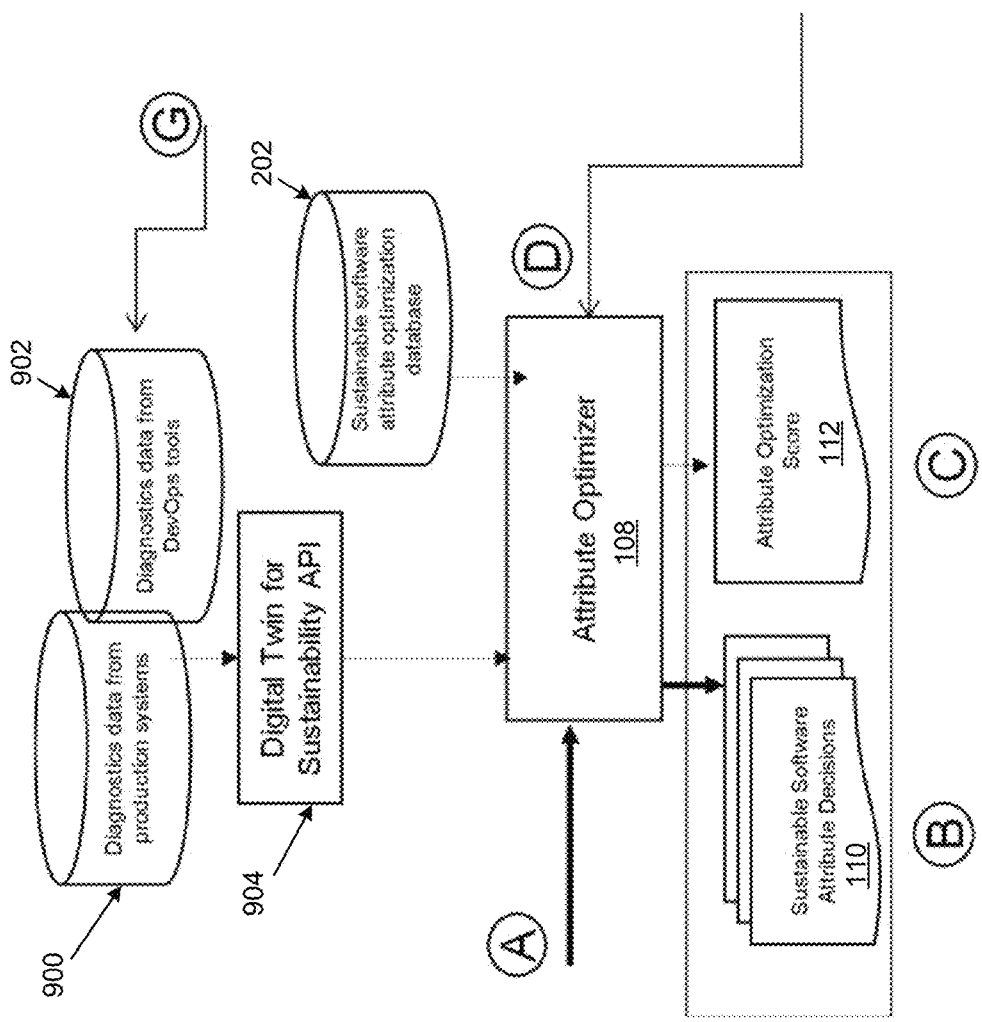
FIG. 9 illustrates operation of an attribute optimizer of the simulation-based software design and delivery attribute tradeoff identification and resolution apparatus of FIG. 1 in accordance with an example of the present disclosure.

FIG. 8 illustrates utilization of text information on what is the tradeoff in choosing an attribute and what is the gain to illustrate operation of the apparatus 100 in accordance with an example of the present disclosure. FIG. 9 illustrates operation of the attribute optimizer 108 of the apparatus 100 in accordance with an example of the present disclosure.

Referring to FIGS. 1, 2, 8, and 9, the attribute optimizer 108 may generate, based on an analysis of the canonical sustainability requirements 106, the sustainable software attribute decisions 110 and the attribute optimization score 112. With respect to the attribute optimizer 108, input to the attribute optimizer 108 may include canonical sustainable software requirements 106, where feedback may include a sustainable software attribute balance score. In this regard, the following Steps 1A, 1B, 1C, 2, 3, 4, and 5 may be implemented by the attribute optimizer 108:

Step 1A: Fetch optimization checklist from a sustainable software attribute optimization database 202 for each sustainable software attribute identified in the requirements acquisition step.

Referring to FIG. 8, at 800, a sample snapshot of the sustainable software attribute optimization database 202 for the three attributes identified is shown. The optimization information may include numerical values such as weight given to the attribute. As shown in FIG. 8, there may also be text information on what is the tradeoff (e.g., at 802) in choosing an attribute and what is the gain (e.g., at 804).

With respect to Steps 1A, 1B, 1C, 2, 3, 4, and 5 implemented by the attribute optimizer 108, referring to FIG. 9, Step 1B may be specified as follows: Fetch sustainable software requirements generated from production and DevOps tools (e.g., at 900 and 902) from the digital twin at 904.

If the requirements specification 104 is for a feature that is additional to an existing production system, there may be sustainable software requirements that can be an addition to what has been identified by the sustainable software attributes analyzer 102.

With respect to Steps 0, 1, 2A, 2B, 3, and 4 implemented by the sustainable software attributes analyzer 102, for Step 2B, A may be specified as the set of attributes identified by the sustainable software attributes analyzer 102. The production system and DevOps tools may be operated with additional sustainability requirements under these attributes. For example, an additional requirement under the attribute 'Decarbonize User Interface and User Experience' that was not part of the sustainability ontology may be specified as "Reduce website payload to improve browsing speed".

Figure 10:
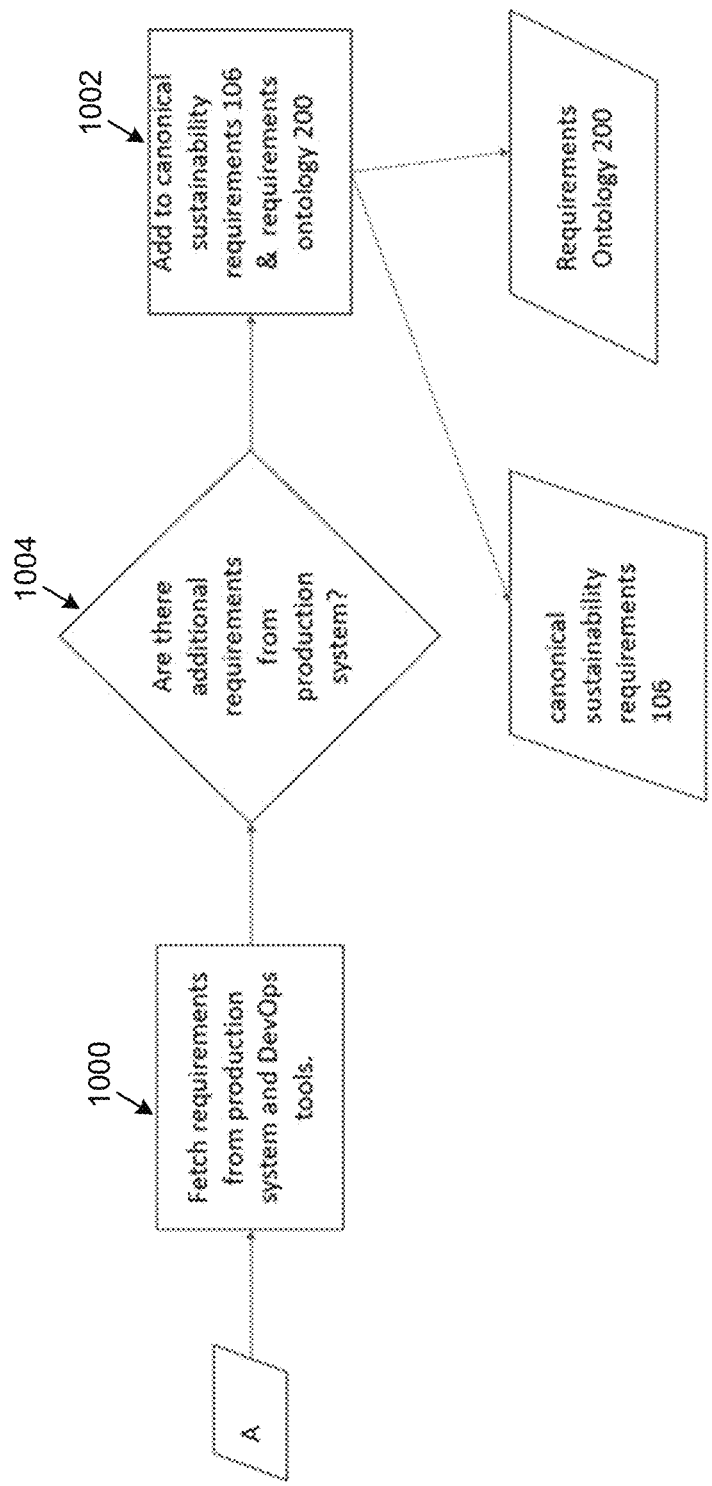
FIG. 10 illustrates implementation of additional requirements to illustrate operation of the simulation-based software design and delivery attribute tradeoff identification and resolution apparatus of FIG. 1 in accordance with an example of the present disclosure.

FIG. 10 illustrates implementation of additional requirements to illustrate operation of the apparatus 100 in accordance with an example of the present disclosure.

With respect to Steps 1A, 1B, 1C, 2, 3, 4, and 5 implemented by the attribute optimizer 108, referring to FIG. 10, Step 1C may be specified as follows: Identify additional sustainability attributes based on production and DevOPS tools.

Referring to FIG. 10, the attribute optimizer 108 may generate, based on the analysis of the canonical sustainability requirements 106, the sustainable software attribute decisions 110 and the attribute optimization score 112 requirements by obtaining requirements from a production system associated with the software application, and determine, from the obtained requirements, whether there are additional requirements for the software application from the production system. Further, the attribute optimizer 108 may add the additional requirements to the canonical sustainability requirements 106 and the requirements ontology.

At 1000, requirements may be fetched from the production system and DevOps tools. At 1002, based on a determination at 1004 that there are additional requirements from the production system, the additional requirements may be added to the canonical sustainability requirements 106 and the requirements ontology 200 to generate updates to the canonical sustainability requirements 106 and the requirements ontology 200.

Additional sustainability attributes may also be obtained from the production system. As an example, 'Adopt a Green Cloud and Edge Architecture' may be an existing attribute of the production system that has not been identified from the automated attribute extraction. This attribute may be appended to A, the set of attributes identified by the sustainable software attributes analyzer 102.

The following may be the recommended sustainable software attributes at the end of this step:
Decarbonize User Interface and User Experience
Maximize Digital Accessibility of Software
Build inclusive software/systems
Adopt a Green Cloud and Edge Architecture Further, the additional requirements under 'Adopt a Green Cloud and Edge Architecture' may be added to the canonical sustainability requirements 106.

Figure 19:
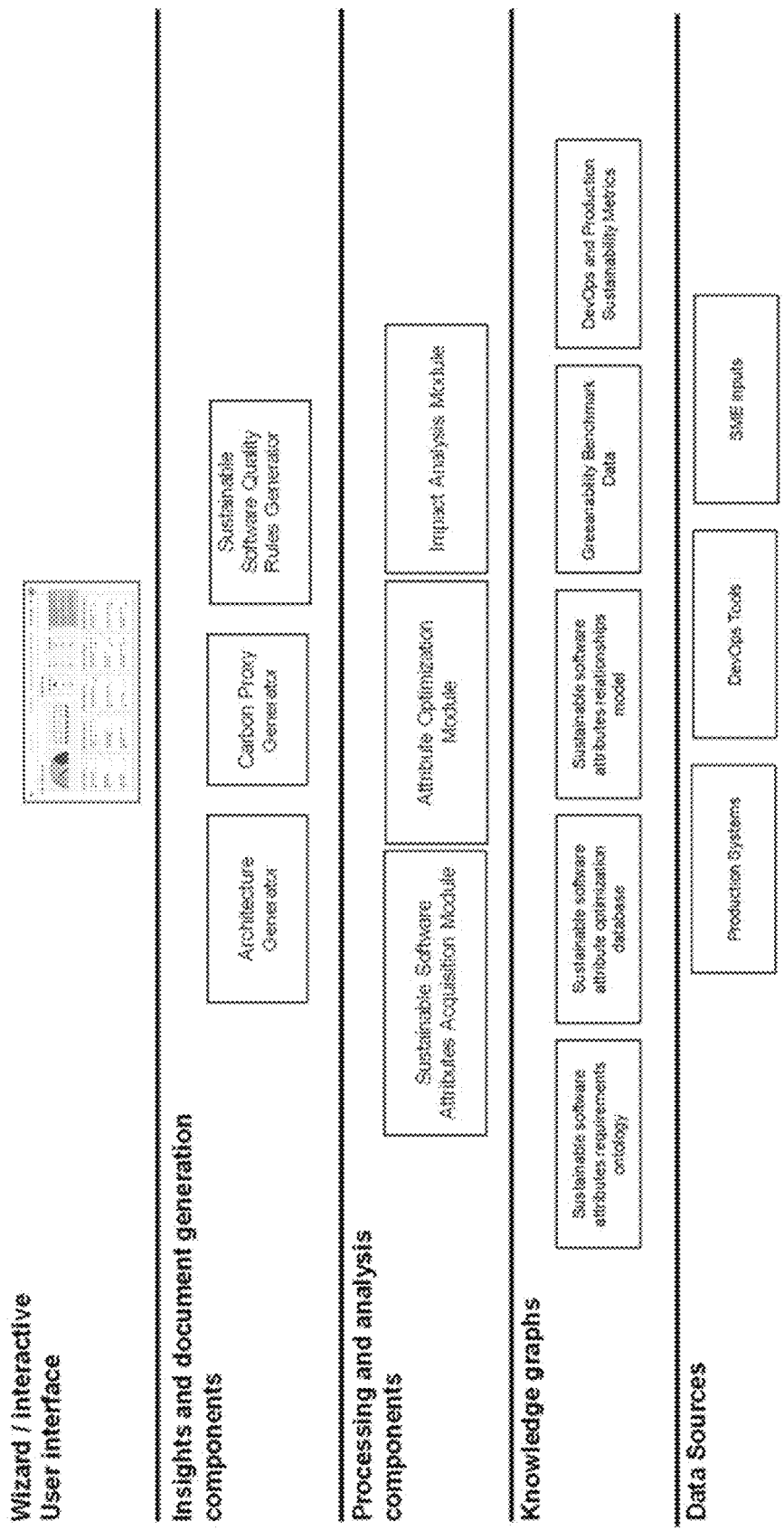
FIG. 19 illustrates a system architecture of the simulation-based software design and delivery attribute tradeoff identification and resolution apparatus of FIG. 1 in accordance with an example of the present disclosure.

With respect to Steps 1A, 1B, 1C, 2, 3, 4, and 5 implemented by the attribute optimizer 108, Step 2 may be specified as follows: Dynamically generate a wizard user interface for a user to browse the optimization checklist for each attribute from the requirements list and the continuous improvement list. The wizard user interface may be presented as shown in FIG. 19. The shortlisted sustainable software attributes may be available for optimization.

With respect to Steps 1A, 1B, 1C, 2, 3, 4, and 5 implemented by the attribute optimizer 108, Step 3 may be specified as follows: For each attribute, generate an attribute optimization score between 0 to 1 based on a weighted average of selected optimization checklist items. The final canonical sustainability requirements 106 may be presented as a checklist in the wizard user interface. For each attribute chosen, $wr_i$ may be specified as the normalized weight of each requirement under the attribute. Further, $wr_{ci}$ may be specified as the normalized weight of each requirement chosen from the checklist for the attribute. Then the optimization score for a particular attribute $a_i$ may be determined as follows:

$$s_i = \Sigma wr_{ci} / \Sigma wr_i$$

With respect to Steps 1A, 1B, 1C, 2, 3, 4, and 5 implemented by the attribute optimizer 108, Step 4 may be specified as follows: Generate a list of sustainable software attribute decisions 110 and checklist items.

FIG. 11 illustrates presentation of a selected list 1100 of checklist items to illustrate operation of the apparatus 100 in accordance with an example of the present disclosure. The selected list 1100 may be presented in the wizard user interface.

With respect to Steps 1A, 1B, 1C, 2, 3, 4, and 5 implemented by the attribute optimizer 108, Step 5 may be specified as follows: Based on the impact analysis and sustainable software attribute balance score, iterate attribute optimized to achieve desired optimization and attribute balance. Every time a checklist items is selected or deselected, the corresponding attribute optimization score $s_i$ may be determined with respect to Step 3. In this regard, $wa_i$ may be specified as the weightage of attribute $a_i$. The attribute optimization score 112 may be determined as follows:

$$\Sigma(s_i * wa_i) / \Sigma wa_i$$

The final list of selected checklist items may form the sustainable software attribute decisions 110.

Based on the aforementioned Steps 1A, 1B, 1C, 2, 3, 4, and 5, an output of the attribute optimizer 108 may include sustainable software attribute decisions 110, and an attribute optimization score 112.

Figure 12:
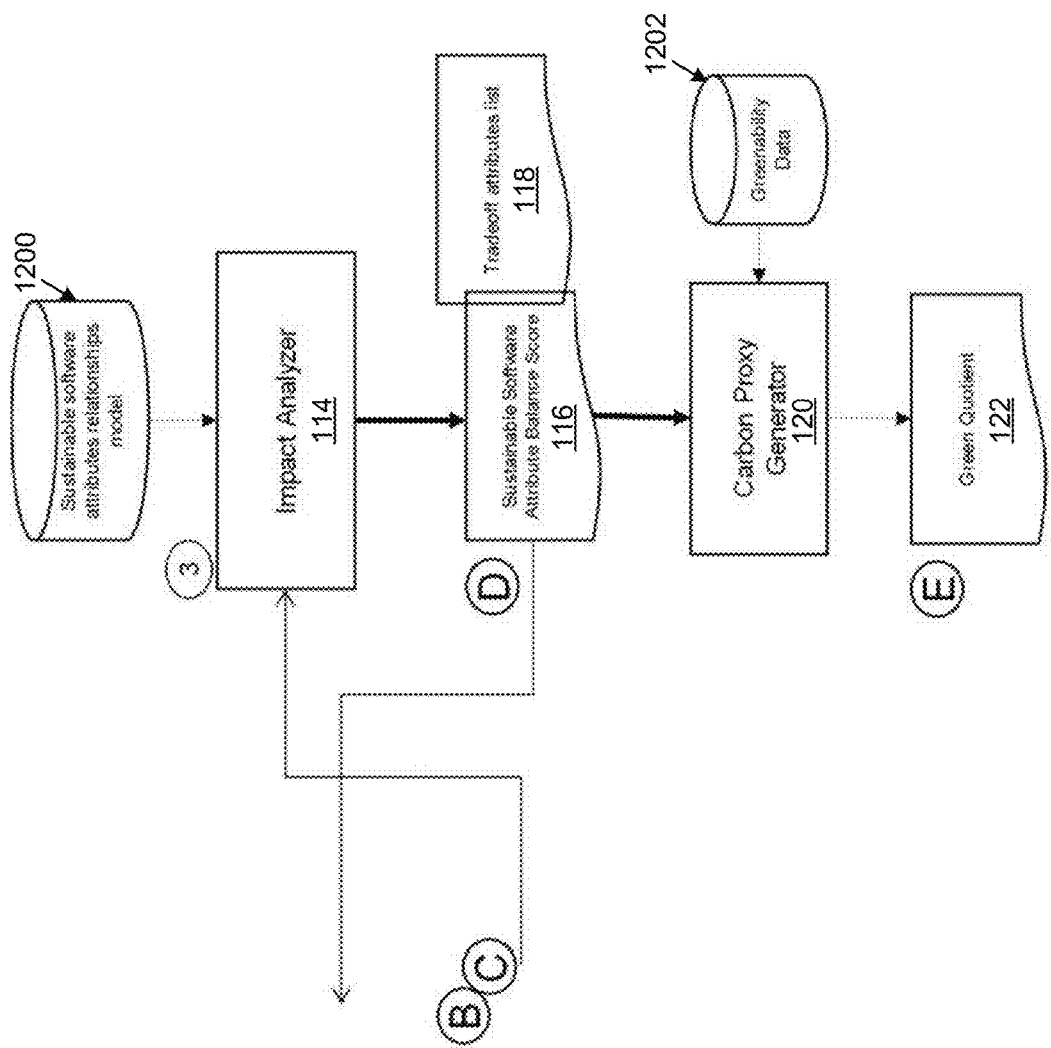
FIG. 12 illustrates operation of an impact analyzer and a carbon proxy generator of the simulation-based software design and delivery attribute tradeoff identification and resolution apparatus of FIG. 1 in accordance with an example of the present disclosure.

FIG. 12 illustrates operation of the impact analyzer 114 and the carbon proxy generator 120 of the apparatus 100 in accordance with an example of the present disclosure.

Referring to FIGS. 1, 2 and 12, the impact analyzer 114 may generate, based on an analysis of the sustainable software attribute decisions 110 and the attribute optimization score 112, the sustainable software attribute balance score 116 and a tradeoff attributes list 118. Further, the carbon proxy generator 120 may generate, based on an analysis of the sustainable software attribute balance score 116 and the tradeoff attributes list 118, a green quotient 122.

With respect to the impact analyzer 114 and carbon proxy generator 120, input to the impact analyzer 114 may include attribute decisions, and attribute optimization score. In this regard, the following Steps 1A, 1B, 2, 3, 4, 5, and 6 may be implemented by the impact analyzer 114 and carbon proxy generator 120: Step 1A: For each of the selected attributes, query a sustainable software attributes relationships model 1200 and extract software attributes with a relationship to the selected attribute.

Step 1B: Obtain type of relationship (reinforcing or conflicting) and relationship intensity.

FIG. 13 illustrates a sample output to illustrate operation of the apparatus 100 in accordance with an example of the present disclosure.

Referring to FIG. 13, a sample outcome 1300 of Step 1A and Step 1B from software attributes relationships model 1200 is shown.

With respect to Steps 1A, 1B, 2, 3, 4, 5, and 6 implemented by the impact analyzer 114 and carbon proxy generator 120, Step 2 may be specified as follows: Construct an impact analysis graph of selected attributes, related attributes and relationships between them. Attributes are the nodes, relationships are edges, thickness of edge is based on the relationship intensity, color of the edge based on type of relationship.

Figure 14:
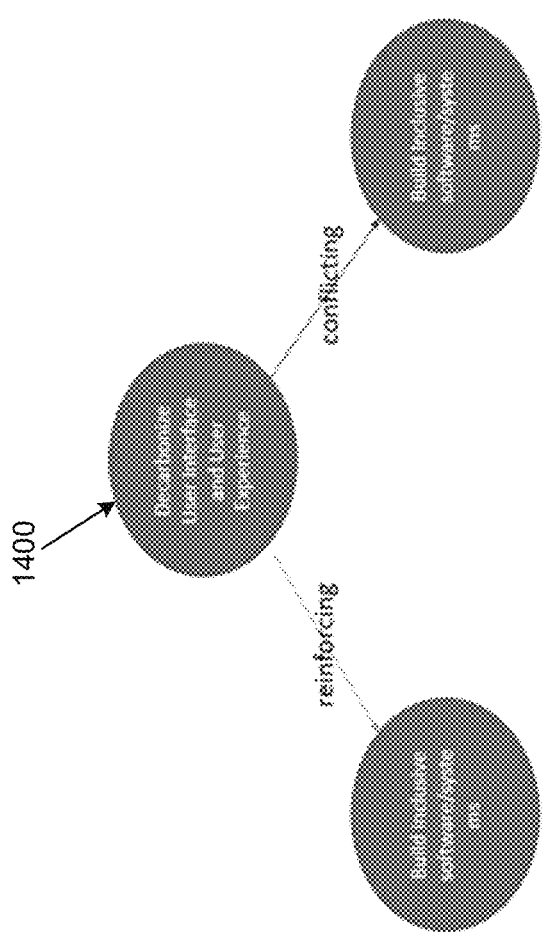
FIG. 14 illustrates loading of software attributes relationships in a comma-separated values (CSV) format into a graph representation to illustrate operation of the simulation-based software design and delivery attribute tradeoff identification and resolution apparatus of FIG. 1 in accordance with an example of the present disclosure.

FIG. 14 illustrates loading of software attributes relationships in a comma-separated values (CSV) format into a graph representation to illustrate operation of the apparatus 100 in accordance with an example of the present disclosure.

Referring to FIG. 14, a graph database such as Neo4J may be used to auto load the software attributes relationships model 1200 in CSV format into a graph representation. FIG. 14 shows a representation of such a graph with 'Decarbonize User Interface and User Experience' as the primary attribute at 1400, and based on the relationships in the sample software attributes relationships model 1200.

With respect to Steps 1A, 1B, 2, 3, 4, 5, and 6 implemented by the impact analyzer 114 and carbon proxy generator 120, Step 3 may be specified as follows: Cluster sustainable software attributes related to the primary optimization goal (e.g., software energy) and represent as a new 'primary goal' node. Reconstruct impact analysis graph with reinforcing and conflicting relationships between other attributes.

Figure 15:
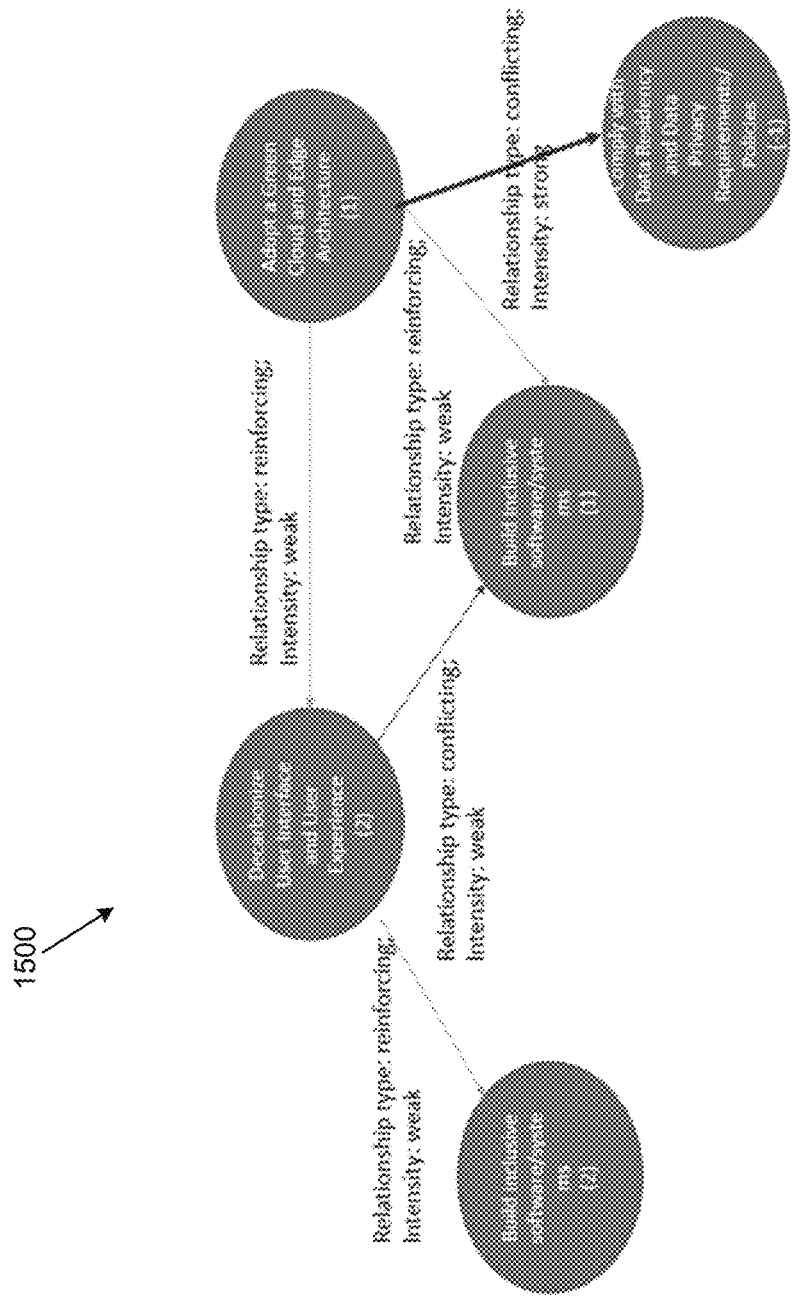
FIG. 15 illustrates reconstructed impact analysis graph to illustrate operation of the simulation-based software design and delivery attribute tradeoff identification and resolution apparatus of FIG. 1 in accordance with an example of the present disclosure.

FIG. 15 illustrates reconstructed impact analysis graph 1500 to illustrate operation of the apparatus 100 in accordance with an example of the present disclosure.

Referring to FIG. 15, the impact analyzer 114 may generate, based on the analysis of the sustainable software attribute decisions 110 and the attribute optimization score 112, the sustainable software attribute balance score 116 and the tradeoff attributes list 118 by adding, for each reinforcing relationship, a reinforcing relationship intensity to the attribute balance score, and reducing, for each conflicting relationship, the attribute balance score by a conflicting relationship intensity. For example, the impact analyzer 114 may add, for each weak reinforcing relationship, a first reinforcing relationship intensity to the attribute balance score, add, for each strong reinforcing relationship, a second reinforcing relationship intensity to the attribute balance score, reduce, for each weak conflicting relationship, the attribute balance score by a first conflicting relationship intensity, and reduce, for each strong conflicting relationship, the attribute balance score by a second conflicting relationship intensity. The first reinforcing relationship intensity may be less than the second reinforcing relationship intensity, and the first conflicting relationship intensity may be greater than the second conflicting relationship intensity.

With respect to Steps 1A, 1B, 2, 3, 4, 5, and 6 implemented by the impact analyzer 114 and carbon proxy generator 120, Step 4 may be specified as follows: Traverse the graph from 'primary goal' node. For every reinforcing relationship, add the relationship intensity to the attribute balance score. For every conflicting relationship, reduce the attribute balance score with conflicting relationship intensity.

Assuming a starting balance score of 1 for each attribute. With each incoming relation, the balance score may be altered as below:
weak reinforcing relation: +1
weak conflicting relation: −1
strong reinforcing relation: +2
strong conflicting relation: −2

Figure 16:
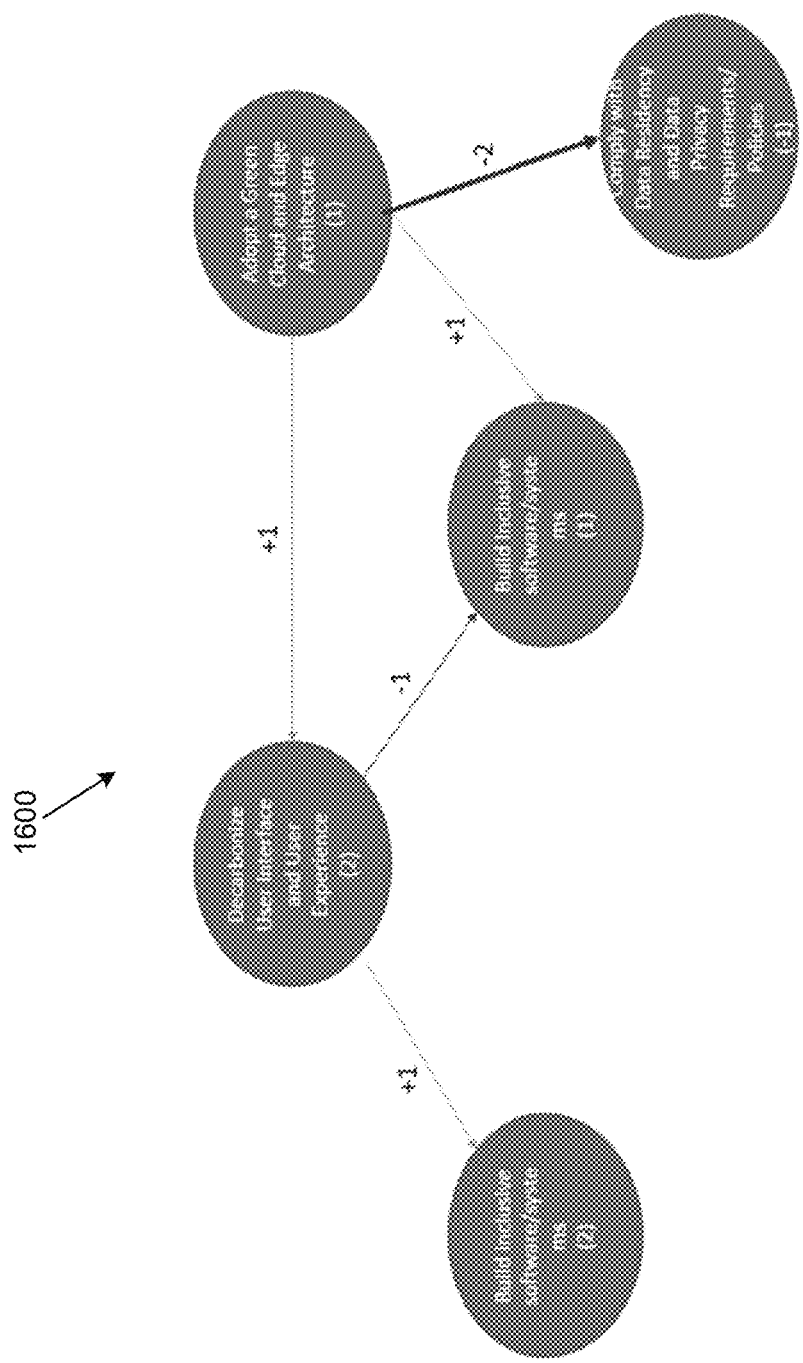
FIG. 16 illustrates a graph including a calculated balance score for each attribute to illustrate operation of the simulation-based software design and delivery attribute tradeoff identification and resolution apparatus of FIG. 1 in accordance with an example of the present disclosure.

FIG. 16 illustrates a graph 1600 including a calculated balance score (e.g., in parenthesis) for each attribute to illustrate operation of the apparatus 100 in accordance with an example of the present disclosure.

The impact analyzer 114 may compare the sustainable software attribute balance score 116 to a threshold, and based on a determination that the sustainable software attribute balance score 116 is less than the threshold, generate an alert.

With respect to Steps 1A, 1B, 2, 3, 4, 5, and 6 implemented by the impact analyzer 114 and carbon proxy generator 120, Step 5 may be specified as follows: At end of the graph traversal, when all edges have been traversed, output the final attribute balance score 116 and tradeoff attributes list 118. If the balance score is lower than threshold, an alert may be generated on the user interface.

The final attribute balance score 116 may be generated as a sum of all the individual scores as follows: 2+2+1+1−1=5

An alert may be triggered for an attribute with balance score of <=0. In the current example, this would be the case with "Comply with Data Residency and Data Privacy Requirements/Policies".

The tradeoff attributes list 118 may include all attributes with incoming conflicting relations. In this case, the list may include the following attributes:
Build inclusive software/systems
Comply with Data Residency and Data Privacy Requirements/Policies With respect to Steps 1A, 1B, 2, 3, 4, 5, and 6 implemented by the impact analyzer 114 and carbon proxy generator 120, Step 6 may be specified as follows: Use the greenability data 1202, for each attribute, calculate the carbon proxy score based on the attribute optimization, and generate green quotient 122.

A subject matter expert (SME) may assign the greenability value for each of the attributes or requirements. The considerations for assigning a greenability score may be based on their understanding of how easily a requirement can be adopted by an organization or what are the organizational priorities and/or constraints.

In this regard, $g_i$ may be specified to be the greenability of an attribute $a_i$, and be may be specified to be its balance score. Further, $s_i$ may be the optimization score for a particular attribute as calculated in Step 3 implemented by the attribute optimizer 108. The normalized green quotient 122 may be specified as follows:

$$(\Sigma(g_i * bi * s_i)/Y(g_i * b_i)) * 100$$

The green quotient 122 may be represented as a percentage of maximum optimizable green quotient value for a set of attributes. This value may be translated into a carbon proxy such as a few green trees. For example, a maximum of 10 trees may be shown for the most optimized scenario, and when the green quotient 122 value is 75%, 7½ trees may be shown in the wizard user interface.

Based on the aforementioned Steps 1A, 1B, 2, 3, 4, 5, and 6, an output of the impact analyzer 114 and carbon proxy generator 120 may include the sustainable software attribute balance score 116, the tradeoff attributes list 118, and the green quotient 122.

Figure 17:
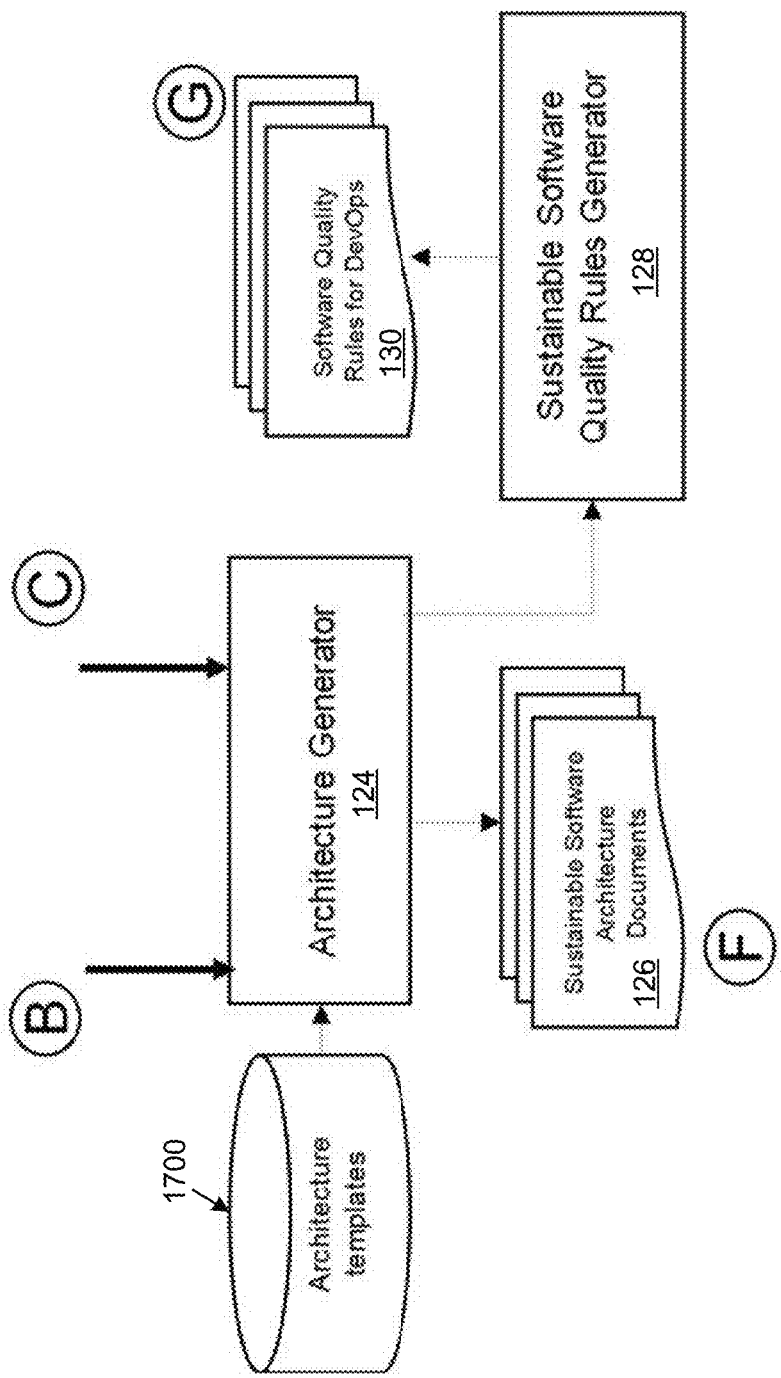
FIG. 17 illustrates operation of an architecture generator and a sustainable software quality rules generator of the simulation-based software design and delivery attribute tradeoff identification and resolution apparatus of FIG. 1 in accordance with an example of the present disclosure.

FIG. 17 illustrates operation of the architecture generator 124 and the sustainable software quality rules generator 128 of the apparatus 100 in accordance with an example of the present disclosure.

Referring to FIGS. 1, 2 and 17, the architecture generator 124 may generate, based on an analysis of the sustainable software attribute decisions 110, the attribute optimization score 112, and the green quotient 122, the architecture document 126. The sustainable software quality rules generator 128 may generate, based on an analysis of the architecture document 126, software quality rules 130. Further, the software generator 132 may generate, based on an analysis of the software quality rules 130, a software application 134.

With respect to the architecture generator 124 and the sustainable software quality rules generator 128, input to the architecture generator 124 and the sustainable software quality rules generator 128 may include the sustainable software attribute decisions 110, and the attribute optimization score 112. In this regard, the following Steps 1, 2, 3, and 4 may be implemented by the architecture generator 124 and the sustainable software quality rules generator 128:

Step 1: For the selected attributes, create a unified architecture template by merging relevant individual architecture templates 1700.

Step 2: Populate the unified architecture template with selected optimization levers, attribute optimization score and impact analysis information.

Step 3: Similarly, identify software quality rules relevant for DevOps.

Every requirement may include a quality rule associated with it that may be added to the DevOps pipeline used in application development. For example, if 'Button color should employ a dark theme' is chosen as one of the requirements for the 'Decarbonize User Interface and User Experience' attribute, then the quality rule relevant for DevOps could be that—colors should pass the Web Content Accessibility Guidelines' (WCAG) AA standard of at least 4.5:1 (when used with body text) at all elevation levels.

With respect to Steps 1, 2, 3, and 4 implemented by the architecture generator 124 and the sustainable software quality rules generator 128, Step 4 may be specified as follows: Inject them directly into the software quality tool integrated for DevOps.

The quality rules may be posted into the DevOps tools via an API.

Based on the aforementioned Steps 1, 2, 3, and 4, an output of the architecture generator 124 and the sustainable software quality rules generator 128 may include an architecture document 126, and software quality rules 130.

Figure 18:
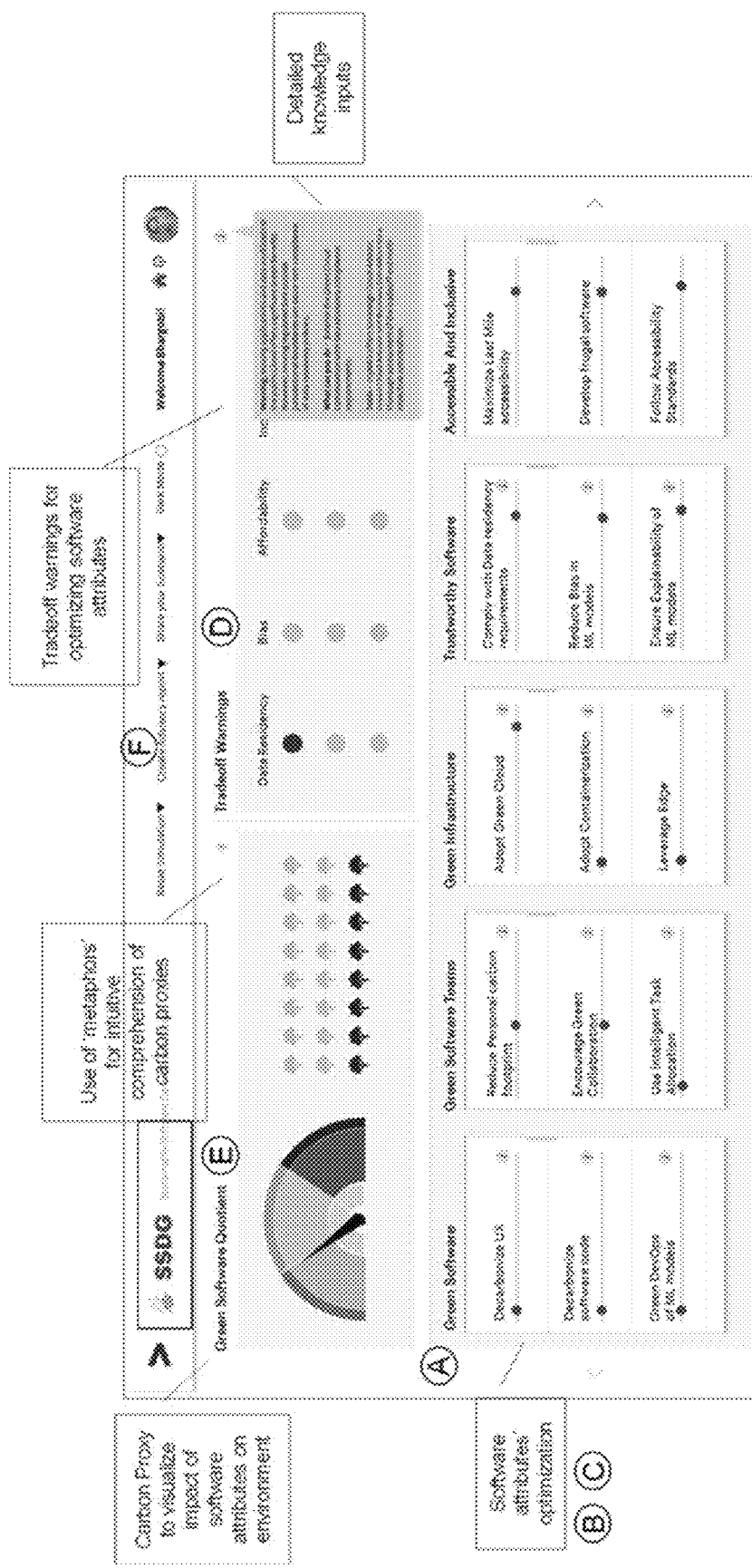
FIG. 18 illustrates an interactive dashboard of the simulation-based software design and delivery attribute tradeoff identification and resolution apparatus of FIG. 1 in accordance with an example of the present disclosure.

FIG. 18 illustrates an interactive dashboard of the apparatus 100 in accordance with an example of the present disclosure.

With respect to sustainable software attributes, for best practices, the apparatus 100 may optimize energy consumption by a digital screen displaying the software application. The apparatus 100 may also reduce the network payload and improve software application performance. This may be achieved by either choosing a dark palette or optimizing images as part of the requirements selected from canonical sustainability requirements 106.

With respect to potentially conflicting software attributes, the apparatus 100 may provide for compliance with data residency requirements, and reduction of bias in machine learning models. For example, "Comply with Data Residency and Data Privacy Requirements/Policies" may identified as one of the conflicting (tradeoff) attributes in Steps 1A, 1B, 2, 3, 4, 5, and 6 implemented by the impact analyzer 114 and carbon proxy generator 120. By adding this attribute to the chosen attribute list, the impact may be mitigated.

With respect to reinforcing software attributes, the apparatus 100 may decarbonize software code, and adopt to green cloud. As seen in step 1C implemented by the attribute optimizer 108, 'Adopt a Green Cloud and Edge Architecture' may not be part of the manual requirements document, but has been identified as part of the automated process steps detailed above.

With respect to potentially conflicting software attributes, the apparatus 100 may implement a green machine learning DevOps accelerator.

As part of step 1B implemented by the impact analyzer 114 and carbon proxy generator 120, a reinforcing relationship may be identified with green machine learning, thus enabling implementation of a green machine learning DevOps accelerator.

FIG. 19 illustrates a system architecture of the apparatus 100 in accordance with an example of the present disclosure.

Figure 20:
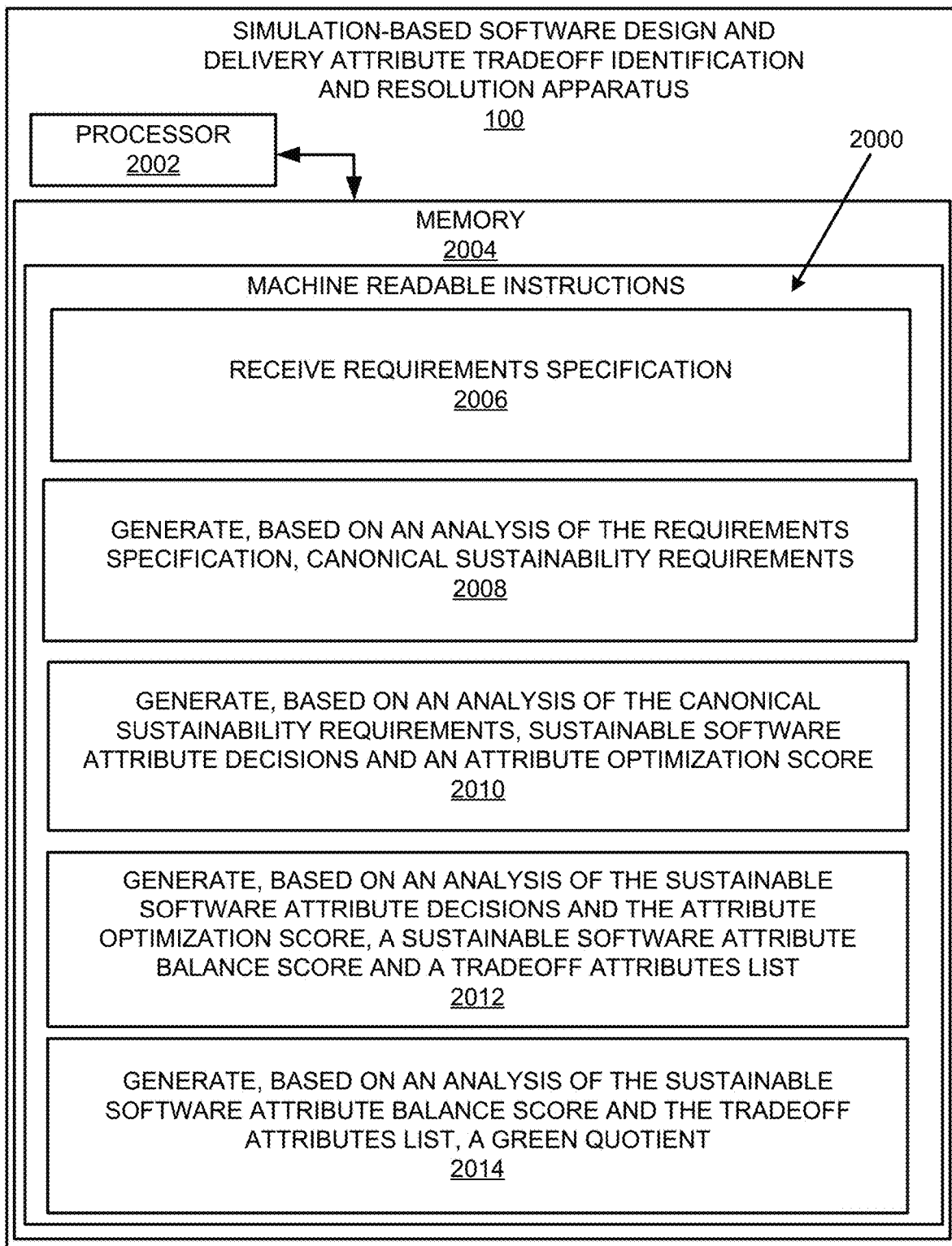
FIG. 20 illustrates an example block diagram for simulation-based software design and delivery attribute tradeoff identification and resolution in accordance with an example of the present disclosure.
Figure 20:
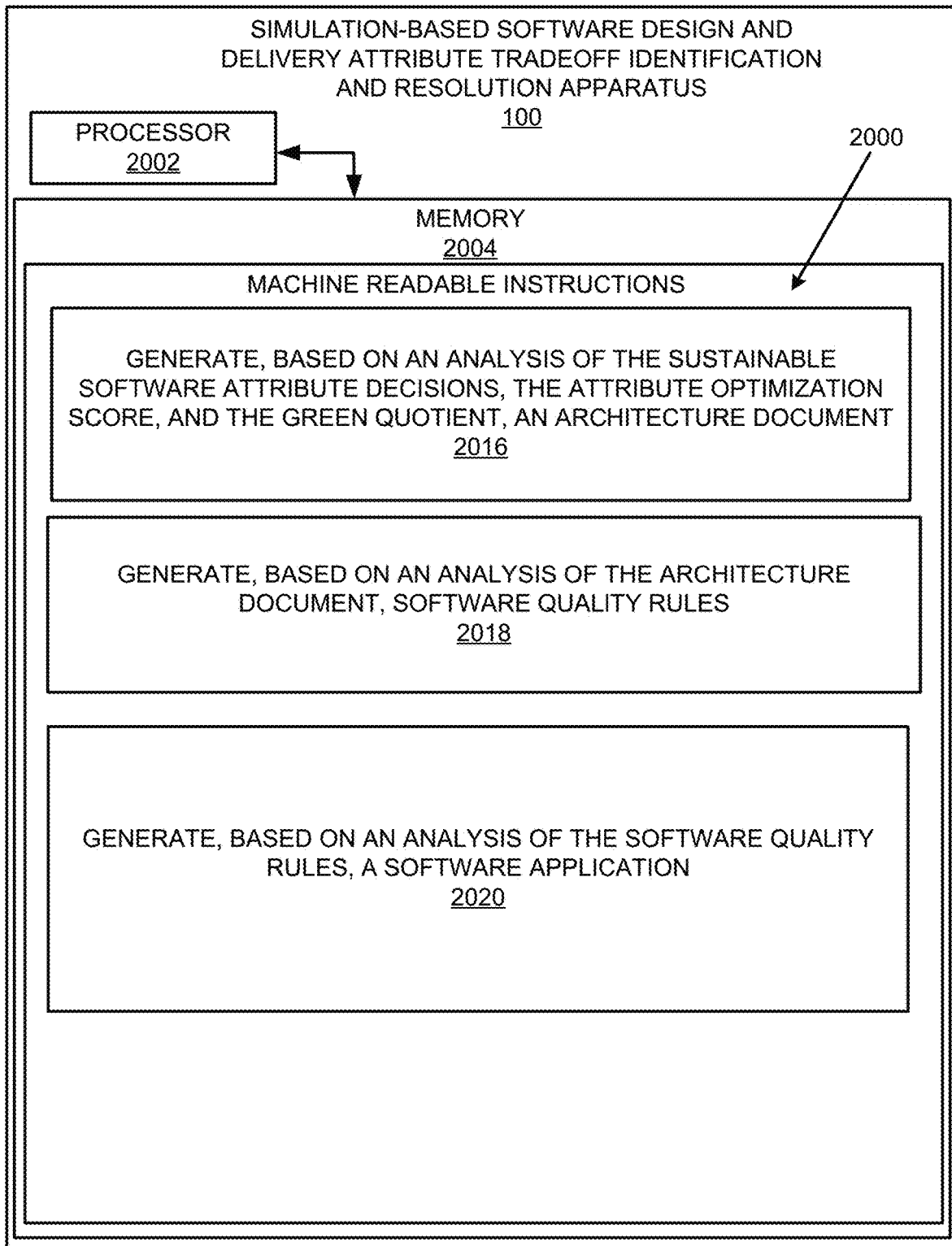
Figure 21:
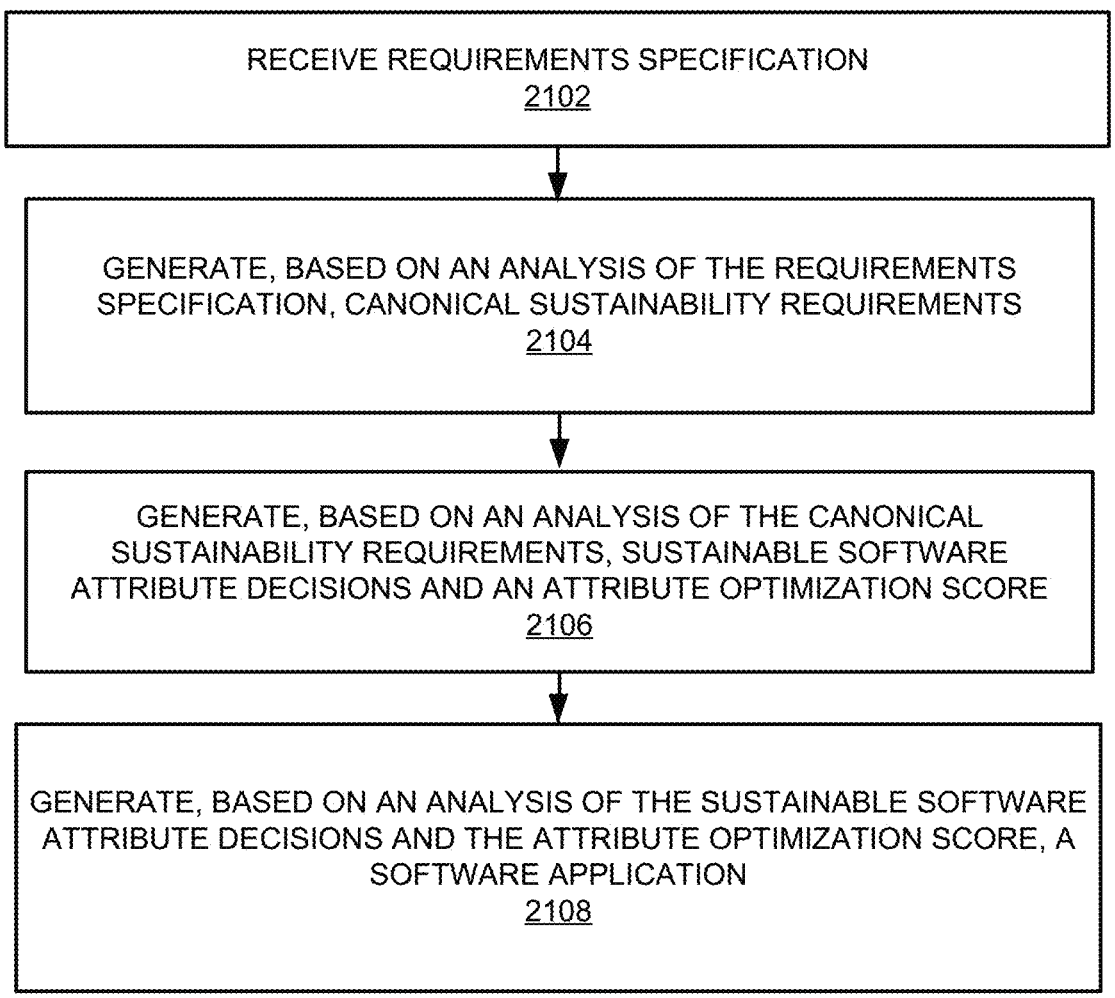
FIG. 21 illustrates a flowchart of an example method for simulation-based software design and delivery attribute tradeoff identification and resolution in accordance with an example of the present disclosure.
Figure 22:
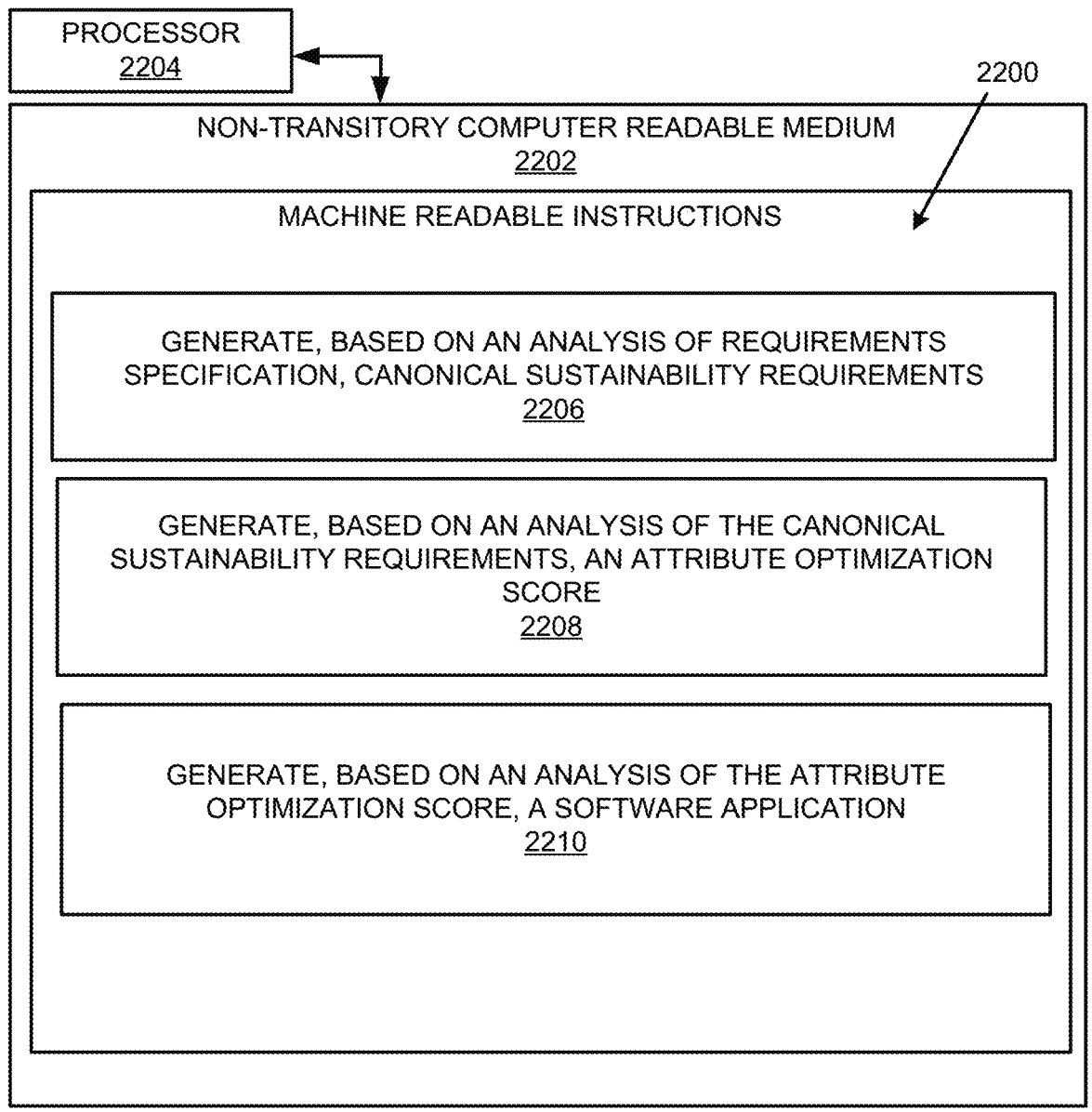
FIG. 22 illustrates a further example block diagram for simulation-based software design and delivery attribute tradeoff identification and resolution in accordance with another example of the present disclosure.

FIGS. 20-22 respectively illustrate an example block diagram 2000, a flowchart of an example method 2100, and a further example block diagram 2200 for simulation-based software design and delivery attribute tradeoff identification and resolution, according to examples. The block diagram 2000, the method 2100, and the block diagram 2200 may be implemented on the apparatus 100 described above with reference to FIG. 1 by way of example and not of limitation. The block diagram 2000, the method 2100, and the block diagram 2200 may be practiced in other apparatus. In addition to showing the block diagram 2000, FIG. 20 shows hardware of the apparatus 100 that may execute the instructions of the block diagram 2000. The hardware may include a processor 2002, and a memory 2004 storing machine readable instructions that when executed by the processor cause the processor to perform the instructions of the block diagram 2000. The memory 2004 may represent a non-transitory computer readable medium. FIG. 21 may represent an example method for simulation-based software design and delivery attribute tradeoff identification and resolution, and the steps of the method. FIG. 22 may represent a non-transitory computer readable medium 2202 having stored thereon machine readable instructions to provide simulation-based software design and delivery attribute tradeoff identification and resolution according to an example. The machine readable instructions, when executed, cause a processor 2204 to perform the instructions of the block diagram 2200 also shown in FIG. 22.

The processor 2002 of FIG. 20 and/or the processor 2204 of FIG. 22 may include a single or multiple processors or other hardware processing circuit, to execute the methods, functions and other processes described herein. These methods, functions and other processes may be embodied as machine readable instructions stored on a computer readable medium, which may be non-transitory (e.g., the non-transitory computer readable medium 2202 of FIG. 22), such as hardware storage devices (e.g., RAM (random access memory), ROM (read only memory), EPROM (erasable, programmable ROM), EEPROM (electrically erasable, programmable ROM), hard drives, and flash memory). The memory 2004 may include a RAM, where the machine readable instructions and data for a processor may reside during runtime.

Referring to FIGS. 1-20, and particularly to the block diagram 2000 shown in FIG. 20, the memory 2004 may include instructions 2006 to receive requirements specification 104.

The processor 2002 may fetch, decode, and execute the instructions 2008 to generate, based on an analysis of the requirements specification 104, canonical sustainability requirements 106.

The processor 2002 may fetch, decode, and execute the instructions 2010 to generate, based on an analysis of the canonical sustainability requirements 106, sustainable software attribute decisions 110 and an attribute optimization score 112.

The processor 2002 may fetch, decode, and execute the instructions 2012 to generate, based on an analysis of the sustainable software attribute decisions 110 and the attribute optimization score 112, a sustainable software attribute balance score 116 and a tradeoff attributes list 118.

The processor 2002 may fetch, decode, and execute the instructions 2014 to generate, based on an analysis of the sustainable software attribute balance score 116 and the tradeoff attributes list 118, a green quotient 122.

The processor 2002 may fetch, decode, and execute the instructions 2016 to generate, based on an analysis of the sustainable software attribute decisions 110, the attribute optimization score 112, and the green quotient 122, an architecture document 126.

The processor 2002 may fetch, decode, and execute the instructions 2018 to generate, based on an analysis of the architecture document 126, software quality rules 130.

The processor 2002 may fetch, decode, and execute the instructions 2020 to generate, based on an analysis of the software quality rules 130, a software application 134.

Referring to FIGS. 1-19 and 21, and particularly FIG. 21, for the method 2100, at block 2102, the method may include receiving requirements specification 104.

At block 2104, the method may include generating, based on an analysis of the requirements specification 214, canonical sustainability requirements 106.

At block 2106, the method may include generating, based on an analysis of the canonical sustainability requirements 106, sustainable software attribute decisions 110 and an attribute optimization score 112.

At block 2108, the method may include generating, based on an analysis of the sustainable software attribute decisions 110 and the attribute optimization score 112, a software application 134.

Referring to FIGS. 1-19 and 22, and particularly FIG. 22, for the block diagram 2200, the non-transitory computer readable medium 2202 may include instructions 2206 to generate, based on an analysis of requirements specification 104, canonical sustainability requirements 106.

The processor 2204 may fetch, decode, and execute the instructions 2208 to generate, based on an analysis of the canonical sustainability requirements 106, an attribute optimization score 112.

The processor 2204 may fetch, decode, and execute the instructions 2210 to generate, based on an analysis of the attribute optimization score 112, a software application 134.

What has been described and illustrated herein is an example along with some of its variations. The terms, descriptions and figures used herein are set forth by way of illustration only and are not meant as limitations. Many variations are possible within the spirit and scope of the subject matter, which is intended to be defined by the following claims—and their equivalents—in which all terms are meant in their broadest reasonable sense unless otherwise indicated.

What is claimed is:

1. A simulation-based software design and delivery attribute tradeoff identification and resolution apparatus comprising:
   a sustainable software attributes analyzer, executed by at least one hardware processor, to receive requirements specification, and
      generate, based on an analysis of the requirements specification, canonical sustainability requirements by:
         extracting text from the requirements specification;
         determining, from the extracted text, whether there is a sustainability string; and
         based on a determination that there is the sustainability string, extracting text from a sustainability section;
   an attribute optimizer, executed by the at least one hardware processor, to
      generate, based on an analysis of the canonical sustainability requirements, sustainable software attribute decisions and an attribute optimization score;
   an impact analyzer, executed by the at least one hardware processor, to
      generate, based on an analysis of the sustainable software attribute decisions and the attribute optimization score, a sustainable software attribute balance score and a tradeoff attributes list;
   a carbon proxy generator, executed by the at least one hardware processor, to
      generate, based on an analysis of the sustainable software attribute balance score and the tradeoff attributes list, a green quotient;
   an architecture generator, executed by the at least one hardware processor, to
      generate, based on an analysis of the sustainable software attribute decisions, the attribute optimization score, and the green quotient, an architecture document;
   a sustainable software quality rules generator, executed by the at least one hardware processor, to
      generate, based on an analysis of the architecture document, software quality rules; and
   a software generator, executed by the at least one hardware processor, to
      generate, based on an analysis of the software quality rules, a software application.

2. The simulation-based software design and delivery attribute tradeoff identification and resolution apparatus according to claim 1, wherein the sustainable software attributes analyzer is executed by at least one hardware processor to generate, based on the analysis of the requirements specification, the canonical sustainability requirements by:
   based on a determination that there is not the sustainability string, extracting text from the requirements specification; and
   determining, from the extracted text from the sustainability section or the requirements specification, a set of keywords that represent software requirements for the software application.

3. The simulation-based software design and delivery attribute tradeoff identification and resolution apparatus according to claim 2, wherein the sustainable software attributes analyzer is executed by at least one hardware processor to generate, based on the analysis of the requirements specification, the canonical sustainability requirements by:
   performing term frequency-inverse document frequency keyword detection on the keywords and a requirements ontology; and
   determining, based on the performance of the term frequency-inverse document frequency keyword detection, an attribute list for the software application.

4. The simulation-based software design and delivery attribute tradeoff identification and resolution apparatus according to claim 3, wherein the sustainable software attributes analyzer is executed by at least one hardware processor to generate, based on the analysis of the requirements specification, the canonical sustainability requirements by:
   extracting, from the requirements specification, text under a requirement description and constraints headings to determine a set of requirement strings;
   performing, by utilizing the requirements ontology, fuzzy string matching on the set of requirement strings; and
   determining, based on the performance of the fuzzy string matching, requirement strings with consistent terminology.

5. The simulation-based software design and delivery attribute tradeoff identification and resolution apparatus according to claim 4, wherein the sustainable software attributes analyzer is executed by at least one hardware processor to generate, based on the analysis of the requirements specification, the canonical sustainability requirements by:
   determining a set of corresponding requirements in the requirements ontology;
   determining a set of the requirement strings with consistent terminology;
   replacing each requirement in the set of corresponding requirements in the requirements ontology with a corresponding similar requirement in the set of the requirement strings with consistent terminology; and
   determining, based on the replacement, the canonical sustainability requirements.

6. The simulation-based software design and delivery attribute tradeoff identification and resolution apparatus according to claim 1, wherein the attribute optimizer is executed by the at least one hardware processor to generate, based on the analysis of the canonical sustainability requirements, the sustainable software attribute decisions and the attribute optimization score requirements by:
obtaining requirements from a production system associated with the software application;
determining, from the obtained requirements, whether there are additional requirements for the software application from the production system; and
adding the additional requirements to the canonical sustainability requirements and the requirements ontology.

7. The simulation-based software design and delivery attribute tradeoff identification and resolution apparatus according to claim 1, wherein the attribute optimizer is executed by the at least one hardware processor to generate, based on the analysis of the canonical sustainability requirements, the sustainable software attribute decisions and the attribute optimization score requirements by:
generating the attribute optimization score based on a weighted average of selected optimization checklist items.

8. The simulation-based software design and delivery attribute tradeoff identification and resolution apparatus according to claim 1, wherein the impact analyzer is executed by the at least one hardware processor to generate, based on the analysis of the sustainable software attribute decisions and the attribute optimization score, the sustainable software attribute balance score and the tradeoff attributes list by:
adding, for each reinforcing relationship, a reinforcing relationship intensity to the attribute balance score; and
reducing, for each conflicting relationship, the attribute balance score by a conflicting relationship intensity.

9. The simulation-based software design and delivery attribute tradeoff identification and resolution apparatus according to claim 1, wherein the impact analyzer is executed by the at least one hardware processor to generate, based on the analysis of the sustainable software attribute decisions and the attribute optimization score, the sustainable software attribute balance score and the tradeoff attributes list by:
adding, for each weak reinforcing relationship, a first reinforcing relationship intensity to the attribute balance score;
adding, for each strong reinforcing relationship, a second reinforcing relationship intensity to the attribute balance score;
reducing, for each weak conflicting relationship, the attribute balance score by a first conflicting relationship intensity; and
reducing, for each strong conflicting relationship, the attribute balance score by a second conflicting relationship intensity,
wherein the first reinforcing relationship intensity is less than the second reinforcing relationship intensity, and the first conflicting relationship intensity is greater than the second conflicting relationship intensity.

10. The simulation-based software design and delivery attribute tradeoff identification and resolution apparatus according to claim 1, wherein the impact analyzer is executed by the at least one hardware processor to:
compare the sustainable software attribute balance score to a threshold; and
based on a determination that the sustainable software attribute balance score is less than the threshold, generate an alert.

11. A method for simulation-based software design and delivery attribute tradeoff identification and resolution comprising:
receiving, by at least one hardware processor, requirements specification;
generating, by the at least one hardware processor, based on an analysis of the requirements specification, canonical sustainability requirements by:
extracting text from the requirements specification;
determining, from the extracted text, whether there is a sustainability string; and
based on a determination that there is the sustainability string, extracting text from a sustainability section;
generating, by the at least one hardware processor, based on an analysis of the canonical sustainability requirements, sustainable software attribute decisions and an attribute optimization score; and
generating, by the at least one hardware processor, based on an analysis of the sustainable software attribute decisions and the attribute optimization score, a software application.

12. The method for simulation-based software design and delivery attribute tradeoff identification and resolution according to claim 11, wherein generating, by the at least one hardware processor, based on the analysis of the sustainable software attribute decisions and the attribute optimization score, the software application, further comprises:
generating, by the at least one hardware processor, based on the analysis of the sustainable software attribute decisions and the attribute optimization score, a sustainable software attribute balance score and a tradeoff attributes list;
generating, by the at least one hardware processor, based on an analysis of the sustainable software attribute balance score and the tradeoff attributes list, a green quotient;
generating, by the at least one hardware processor, based on an analysis of the sustainable software attribute decisions, the attribute optimization score, and the green quotient, an architecture document;
generating, by the at least one hardware processor, based on an analysis of the architecture document, software quality rules; and
generating, by the at least one hardware processor, based on an analysis of the software quality rules, the software application.

13. The method for simulation-based software design and delivery attribute tradeoff identification and resolution according to claim 11, wherein generating, by the at least one hardware processor, based on the analysis of the requirements specification, the canonical sustainability requirements, further comprises:
based on a determination that there is not the sustainability string, extracting, by the at least one hardware processor, text from the requirements specification; and
determining, by the at least one hardware processor, from the extracted text from the sustainability section or the requirements specification, a set of keywords that represent software requirements for the software application.

14. The method for simulation-based software design and delivery attribute tradeoff identification and resolution according to claim 13, wherein generating, by the at least one hardware processor, based on the analysis of the requirements specification, the canonical sustainability requirements, further comprises:
- performing, by the at least one hardware processor, term frequency-inverse document frequency keyword detection on the keywords and a requirements ontology; and
- determining, based on the performance of the term frequency-inverse document frequency keyword detection, an attribute list for the software application.

15. The method for simulation-based software design and delivery attribute tradeoff identification and resolution according to claim 14, wherein generating, by the at least one hardware processor, based on the analysis of the requirements specification, the canonical sustainability requirements, further comprises:
- extracting, by the at least one hardware processor, from the requirements specification, text under a requirement description and constraints headings to determine a set of requirement strings;
- performing, by the at least one hardware processor, by utilizing the requirements ontology, fuzzy string matching on the set of requirement strings; and
- determining, by the at least one hardware processor, based on the performance of the fuzzy string matching, requirement strings with consistent terminology.

16. The method for simulation-based software design and delivery attribute tradeoff identification and resolution according to claim 15, wherein generating, by the at least one hardware processor, based on the analysis of the requirements specification, the canonical sustainability requirements, further comprises:
- determining, by the at least one hardware processor, a set of corresponding requirements in the requirements ontology;
- determining, by the at least one hardware processor, a set of the requirement strings with consistent terminology;
- replacing, by the at least one hardware processor, each requirement in the set of corresponding requirements in the requirements ontology with a corresponding similar requirement in the set of the requirement strings with consistent terminology; and
- determining, by the at least one hardware processor, based on the replacement, the canonical sustainability requirements.

17. A non-transitory computer readable medium having stored thereon machine readable instructions, the machine readable instructions, when executed by at least one hardware processor, cause the at least one hardware processor to:
- generate, based on an analysis of requirements specification, canonical sustainability requirements by:
  - extracting text from the requirements specification;
  - determining, from the extracted text, whether there is a sustainability string; and
  - based on a determination that there is the sustainability string, extracting text from a sustainability section;
- generate, based on an analysis of the canonical sustainability requirements, an attribute optimization score; and
- generate, based on an analysis of the attribute optimization score, a software application.

18. The non-transitory computer readable medium according to claim 17, wherein the machine readable instructions to generate, based on the analysis of the canonical sustainability requirements, the attribute optimization score, when executed by the at least one hardware processor, further cause the at least one hardware processor to:
- generate, based on an analysis of the canonical sustainability requirements, sustainable software attribute decisions and the attribute optimization score; and
- generate, based on an analysis of the sustainable software attribute decisions and the attribute optimization score, the software application.

19. The non-transitory computer readable medium according to claim 18, wherein the machine readable instructions, when executed by the at least one hardware processor, further cause the at least one hardware processor to:
- generate, based on the analysis of the sustainable software attribute decisions and the attribute optimization score, a sustainable software attribute balance score and a tradeoff attributes list;
- generate, based on an analysis of the sustainable software attribute balance score and the tradeoff attributes list, a green quotient;
- generate, based on an analysis of the sustainable software attribute decisions, the attribute optimization score, and the green quotient, an architecture document;
- generate, based on an analysis of the architecture document, software quality rules; and
- generate, based on an analysis of the software quality rules, the software application.

20. The non-transitory computer readable medium according to claim 19, wherein the machine readable instructions to generate, based on the analysis of the sustainable software attribute decisions and the attribute optimization score, the sustainable software attribute balance score and the tradeoff attributes list, when executed by the at least one hardware processor, further cause the at least one hardware processor to:
- add, for each reinforcing relationship, a reinforcing relationship intensity to the attribute balance score; and
- reduce, for each conflicting relationship, the attribute balance score by a conflicting relationship intensity.

* * * * *